US010529614B2

(12) United States Patent
Marinov

(10) Patent No.: US 10,529,614 B2
(45) Date of Patent: Jan. 7, 2020

(54) SETTING UP ULTRA-SMALL OR ULTRA-THIN DISCRETE COMPONENTS FOR EASY ASSEMBLY

(71) Applicant: Uniqarta, Inc., Cambridge, MA (US)

(72) Inventor: Val Marinov, Fargo, ND (US)

(73) Assignee: Uniqarta, Inc., Cambridge, MA (US)

( * ) Notice: Subject to any disclaimer, the term of this patent is extended or adjusted under 35 U.S.C. 154(b) by 0 days.

(21) Appl. No.: 15/501,330

(22) PCT Filed: Aug. 4, 2015

(86) PCT No.: PCT/US2015/043550
§ 371 (c)(1),
(2) Date: Feb. 2, 2017

(87) PCT Pub. No.: WO2016/022528
PCT Pub. Date: Feb. 11, 2016

(65) Prior Publication Data
US 2017/0365499 A1 Dec. 21, 2017

Related U.S. Application Data

(60) Provisional application No. 62/033,595, filed on Aug. 5, 2014, provisional application No. 62/060,928, filed on Oct. 7, 2014.

(51) Int. Cl.
H01L 21/683 (2006.01)
B32B 37/00 (2006.01)
(Continued)

(52) U.S. Cl.
CPC ........ H01L 21/6836 (2013.01); B32B 37/025 (2013.01); B32B 38/0004 (2013.01); B32B 38/10 (2013.01); B32B 38/1858 (2013.01); B32B 2037/268 (2013.01); B32B 2457/14 (2013.01)

(58) Field of Classification Search
None
See application file for complete search history.

(56) References Cited

U.S. PATENT DOCUMENTS 7,802,356 B1 * 9/2010 Chang ...................... H03H 3/04
29/25.35
9,209,142 B1 * 12/2015 Lambert ................. H01L 24/03
(Continued)

FOREIGN PATENT DOCUMENTS

CN 107107600 A 8/2017
EP 1041620 10/2000
(Continued)

OTHER PUBLICATIONS

European Supplemental Search Report issued in corresponding European application 15830376.8 dated Feb. 23, 2018 (11 pages).
(Continued)

Primary Examiner — Lex H Malsawma
(74) Attorney, Agent, or Firm — Fish & Richardson P.C.

(57) ABSTRACT

Among other things a method including releasing a discrete component from an interim handle and depositing a discrete component on a handle substrate, attaching the handle substrate to the discrete component, and removing the handle substrate from the discrete component.

23 Claims, 14 Drawing Sheets

(51) Int. Cl.
*B32B 38/00* (2006.01)
*B32B 38/10* (2006.01)
*B32B 38/18* (2006.01)
*B32B 37/26* (2006.01)

(56) References Cited

U.S. PATENT DOCUMENTS

| | | | |
|---|---|---|---|
| 2001/0000079 | A1 | 3/2001 | Usami et al. |
| 2002/0019454 | A1* | 2/2002 | Kanai .................. C08K 5/5397 522/64 |
| 2004/0009649 | A1 | 1/2004 | Kub et al. |
| 2006/0177994 | A1* | 8/2006 | Tolchinsky ......... H01L 21/6835 438/458 |
| 2007/0040258 | A1* | 2/2007 | Sheats ................. H01L 23/5389 257/686 |
| 2008/0054426 | A1* | 3/2008 | Ohno ................. H01L 21/6835 257/678 |
| 2010/0317132 | A1* | 12/2010 | Rogers ................ H01L 25/0753 438/27 |
| 2013/0323907 | A1* | 12/2013 | Oosterhuis ........ H01L 21/67132 438/460 |
| 2014/0035129 | A1* | 2/2014 | Stuber ............... H01L 23/49811 257/737 |

FOREIGN PATENT DOCUMENTS

| | | |
|---|---|---|
| JP | H08-316194 | 11/2006 |
| JP | 2008-258412 | 10/2008 |
| JP | 2013-543262 | 11/2013 |
| WO | WO 2012/142177 | 10/2012 |
| WO | WO 2016/022528 | 2/2016 |

OTHER PUBLICATIONS

EPO Communication Pursuant to Rules 161(2) & 162 EPC from European application 15830376.8 dated Mar. 28, 2018 (2 pages).
Response to EPO Communication Pursuant to Rules 161(2) & 162 EPC from European application 15830376.8 filed Sep. 28, 2017 (10 pages).
EPO Extended European Search Report from European application 15830376.8 dated May 29, 2018 (10 pages).
International Search Report and Written Opinion from PCT application PCT/US2015/043550 dated Dec. 30, 2015 (21 pages).
Chinese Office Action from Chinese applications 201580053887.3 dated Nov. 7, 2018 (7 pages).
European Extended Search Report from European application 15830376.8 dated May 29, 2018 (10 pages).
EPO Communication Pursuant to Rules 70(2) and 70a(2) EPC from European application 15830376.8 dated Jun. 15, 2018 (1 page).
Japanese Office Action with English translation from Japanese application 2017-527190 dated Sep. 21, 2018 (10 pages).
International Preliminary Report on Patentability from PCT application PCT/US2015/043550 dated Feb. 16, 2017 (11 pages).
Marinov et al., "Laser-assisted ultrathin bare die packaging: a route to a new class of microelectonic devices," Proc of SPIE, 2013, 8608: 86080L-1-19.
Marinov et al., "Laser-assisted ultrathin die packaging: Insights from a process study," Microelectronic Engineering, 2013, 101: 23-30.
Miller et al., "Noncontact Selective Laser-Assisted Placement of Thinned Semiconductor Dice," IEEE Transactions on Components, Packaging and Manufacturing Technology, Jun. 2012, 2(6): 971-978.
Sawar and Marinov, "Reliability of Embedded Ultrathin Chips Subjected to Cyclic Stresses," J Microelectronics and Electronic Packaging, 2012, 9: 104-111.
Uniqarta.com, "Ultra-thin, Flexible Chip Assembly," http://uniqarta.com/technology.html, retrieved on Jan. 13, 2016, 2 pages.

* cited by examiner

SETTING UP ULTRA-SMALL OR ULTRA-THIN DISCRETE COMPONENTS FOR EASY ASSEMBLY

CROSS-REFERENCE TO RELATED APPLICATIONS

This application is a U.S. National Phase Application of International Patent Application No. PCT/US2015/043550, filed on Aug. 4, 2015, which claims the benefit of U.S. Provisional Application Ser. No. 62/033,595, filed on Aug. 5, 2014, and of U.S. Provisional Application Ser. No. 62/060,928, filed on Oct. 7, 2014, the contents of all are incorporated herein by reference in their entirety.

BACKGROUND

This description relates generally to setting up ultra-small or ultra-thin discrete components for easy assembly.

Known assembly processes automate transferring items from one place to another using robotic pick-and-place systems.

SUMMARY

Methods for setting up ultra-small or ultra-thin discrete components for easy pick and place in integrated circuit packaging are contemplated as disclosed in U.S. Application No. 62/033,595 filed on Aug. 5, 2014, which is incorporated here by reference in its entirety.

In general, in an aspect, a method includes releasing a discrete component from a carrier and depositing a discrete component on a handle substrate, the discrete component having an ultra-thin, an ultra-small, or an ultra-thin and ultra-small configuration, the handle substrate having a thickness of at least 50 microns and at least one side length of at least 300 microns.

Implementations may include one or a combination of any two or more of the following features. The method may also include a release layer to the handle substrate such that the discrete component is releasably attached to the release layer. The release layer is a thermally sensitive material. The release layer is an ultraviolet ("UV") light sensitive material. The release layer includes a first layer and a second layer. The first layer is attached to the handle and a second layer oriented for discrete component deposition. The second layer is parallel to the first layer. The second layer is UV sensitive. The second layer is thermally sensitive. The first layer is a permanent adhesive. The thermal sensitivity of the second layer causes a decrease in an adhesive strength in response to an application of thermal energy. The thermal sensitivity of the second layer causes an increase in an adhesive strength in response to an application of thermal energy. The UV light sensitivity causes an increase in adhesive strength in response to an application of UV light or causes a decrease in adhesive strength in response to an application of UV light. The method includes transferring the discrete component on the handle substrate to contact a device substrate. The method includes releasing the discrete component from the handle substrate to deposit the discrete component onto the device substrate. Depositing the discrete component onto the device substrate includes bonding the discrete component to the device substrate. Releasing the discrete component from the handle is contemporaneous with bonding the discrete component to the device substrate. Releasing the discrete component from the handle is in response to the bonding the discrete component to the device substrate. Releasing the discrete component from the handle is caused by the bonding the discrete component to the device substrate. Releasing the discrete component from the handle is completed after bonding the discrete component to the device substrate. The discrete component is released from the handle through the bonding with the device substrate. Bonding further includes delivering thermal energy or energy of UV light to both bond the discrete component with the substrate and release the discrete component from the handle. The handle substrate remains in contact with the device substrate upon release of the handle substrate from the discrete component. The method further includes removing the handle substrate from the discrete component. Removing the handle substrate can include applying at least one of the following: a brush, a blade, compressed air, a vacuum force, a vibration, or gravity force, or any combination of two or more of them. The handle substrate includes a thickness of between 49 and 801 microns, 100-800 microns, and/or 300 and 800 microns. The handle substrate includes at least one side between 400 and 600 microns long.

In general, in an aspect, an apparatus includes a discrete component having an ultra-thin, an ultra-small, or an ultra-thin and ultra-small configuration and a handle substrate releasably attached to the discrete component, the handle and the discrete component having a configuration that is thicker and broader than the discrete component Implementations may include one or a combination of any two or more of the following features. The apparatus also includes a release layer attached to the handle substrate such that the discrete component is releasably attached to the release layer. The release layer is a thermally sensitive material. The release layer is an ultraviolet light sensitive material. The release layer includes a first layer and a second layer. The release layer includes a first layer attached to the handle and a second layer oriented for discrete component deposition. The second layer is parallel to the first layer. The second layer is UV sensitive. The second layer is thermally sensitive. The first layer is sensitive permanent adhesive. The thermal sensitivity of the second layer causes a decrease in an adhesive strength in response to heat exceeding a thermal parameter of the adhesive. The thermal sensitivity of the second layer causes an increase in an adhesive strength in response to heat exceeding a thermal parameter of the adhesive. The UV light sensitivity causes an increase in adhesive strength in response to an application of UV light. The UV light sensitivity causes a decrease in adhesive strength in response to the application of UV light. The handle substrate includes a thickness of between 49 and 801 microns. The handle substrate includes at least one side between 100 and 800 microns long. The handle substrate includes at least one side between 300 and 800 microns long. The handle substrate includes at least one side between 400 and 600 microns long.

In general, in an aspect, a method includes applying a process step to cause a material between a surface of an ultra-thin, an ultra-small, or an ultra-thin and ultra-small discrete component and a substrate to which the ultra-thin and ultra-small discrete component is to be attached, to change to a state in which the material holds the ultra-thin and ultra-small discrete component on the substrate. The processing step simultaneously causing a material that temporarily holds an opposite surface of the ultra-thin and ultra-small discrete component on a handle that is being held by a chuck of a pick and place tool, to change to a state in which the material no longer holds the ultra-thin and ultra-small discrete component on the handle. The method includes causing the change in state includes delivering thermal energy, UV light, or both. The material that temporarily holds an opposite surface of the discrete component on a handle substrate includes a release layer including a first layer and a second layer. The material that temporarily holds an opposite surface of the discrete component on a handle substrate includes a release layer including a first layer attached to the handle and a second layer that temporarily holds the discrete component. The release layer is a thermally sensitive material. The release layer is a UV light sensitive material. The second layer is parallel to the first layer. The first layer is permanent adhesive, and the second layer is thermally sensitive. The thermal sensitivity of the second layer causes a decrease in an adhesive strength in response to an application of thermal energy. The thermal sensitivity of the second layer causes an increase in an adhesive strength in response an application of thermal energy. The UV light sensitivity causes an increase in an adhesive strength in response to the application of a UV light. The UV light sensitivity causes a decrease in an adhesive strength in response to an application of UV light. The handle includes a thickness of between 49 and 801 microns. The handle includes at least one side between 100 and 600 microns long. The handle includes at least one side between 300 and 800 microns long. The handle includes at least one side between 400 and 600 microns long.

In general, in an aspect, a method includes depositing an ultra-thin wafer onto a handle substrate; and releasing a discrete component from the ultra-thin wafer, the discrete component having an ultra-thin configuration, handle substrate having a thickness of at least 50 microns.

Implementations may include one or a combination of any two or more of the following features.

The method also includes attaching a release layer to the handle substrate such that the ultra-thin wafer is releasably attached to the release layer. Releasing the discrete component includes dicing the ultra-thin wafer. Dicing the ultra-wafer further includes dicing the handle substrate to form a diced-handle substrate such that the discrete component is releasably attached to the handle substrate. The discrete component is sized to cover the surface of the diced-handle substrate. The release layer is a thermally sensitive material. The release layer is an ultraviolet light sensitive material. The release layer includes a first and a second layer. The release layer includes a first layer attached to handle and a second layer oriented for discrete component deposition. The second layer is parallel to the first layer. The second layer is UV sensitive. The second layer is thermally sensitive. The first layer is permanent adhesive. The thermal sensitivity of the second layer causes a decrease in an adhesive strength in response to an application of thermal energy. The thermal sensitivity of the second layer causes an increase in an adhesive strength in response to an application of thermal energy. The UV light sensitivity causes an increase in adhesive strength in response to an application of UV light. The UV light sensitivity causes a decrease in adhesive strength in response to an application of UV light. The method also including transferring the discrete component on the handle substrate to contact a device substrate. The method also including releasing the discrete component from the handle substrate to deposit the discrete component onto the device substrate. Depositing the discrete component onto the device substrate includes bonding the discrete component to the device substrate. Releasing the discrete component from the handle is contemporaneous with bonding the discrete component to the device substrate. Releasing the discrete component from the handle is in response to the bonding the discrete component to the device substrate. Releasing the discrete component from the handle is caused by the bonding the discrete component to the device substrate. Releasing the discrete component from the handle is completed after bonding the discrete component to the device substrate. The discrete component is released from the handle through the bonding with the device substrate. The bonding further includes delivering thermal energy or UV-light to both bond the discrete component with the substrate and release the discrete component from the handle. The handle substrate includes a thickness of between 49 and 801 microns. The handle substrate remains in contact with the device substrate upon release of the handle substrate from the discrete component. The method further includes removing the handle substrate from the discrete component. Removing the handle substrate can include applying at least one of the following: a brush, a blade, compressed air, a vacuum force, a vibration, liquid jet, electrostatic, electromagnetic force or gravity force, or any combination of two or more of them. The handle includes at least one side between 100 and 600 microns long. The handle includes at least one side between 300 and 800 microns long. The handle includes at least one side between 400 and 600 microns long.

In general, in an aspect, an apparatus includes a discrete component having an ultra-thin configuration and a handle substrate releasably attached to the discrete component, the handle and the discrete component having a configuration that is thicker than the discrete component. Implementations may include one or a combination of any two or more of the following features. The apparatus also includes a release layer attached to the handle substrate such that the discrete component is releasably attached to the release layer. The release layer is a thermally sensitive material. The release layer is an ultraviolet light sensitive material. The release layer includes a first layer and a second layer. The release layer includes a first layer attached to the handle and a second layer oriented for discrete component deposition. The second layer is parallel to the first layer. The second layer is UV sensitive. The second layer is thermally sensitive. The first layer is sensitive permanent adhesive. The thermal sensitivity of the second layer causes a decrease in an adhesive strength in response to heat exceeding a thermal parameter of the adhesive. The thermal sensitivity of the second layer causes an increase in adhesive strength in response to heat exceeding a thermal parameter of the adhesive. The UV light sensitivity causes an increase in adhesive strength in response to an application of UV light. The UV light sensitivity causes a decrease in adhesive strength in response to the application of UV light. The handle substrate includes a thickness of between 49 and 801 microns. The handle substrate includes at least one side between 100 and 800 microns long. The handle substrate includes at least one side between 300 and 800 microns long. The handle substrate includes at least one side between 400 and 600 microns long.

In general, in an aspect, a method includes applying a process step to cause a material between a surface of an ultra-thin discrete component and a substrate to which the ultra-thin discrete component is to be attached, to change to a state in which the material holds the discrete component on the substrate. The processing step simultaneously causing a material that temporarily holds an opposite surface of the ultra-thin discrete component on a handle that is being held by a chuck of a pick and place tool, to change to a state in which the material no longer holds the discrete component on the handle.

Implementations may include one or a combination of any two or more of the following features. The method includes causing the change in state includes delivering thermal energy, UV light, or both. The material that temporarily holds an opposite surface of the discrete component on a handle substrate includes a release layer including a first layer and a second layer. The material that temporarily holds an opposite surface of the discrete component on a handle substrate includes a release layer including a first layer attached to the handle and a second layer that temporarily holds the discrete component. The release layer is a thermally sensitive material. The release layer is a UV light sensitive material. The second layer is parallel to the first layer. The first layer is permanent adhesive, and the second layer is thermally sensitive. The second layer is UV sensitive. The second layer is thermally sensitive. The thermal sensitivity of the second layer causes a decrease in an adhesive strength in response to an application of thermal energy. The thermal sensitivity of the second layer causes an increase in an adhesive strength in response an application of thermal energy. The UV light sensitivity causes an increase in an adhesive strength in response to the application of a UV light. The UV light sensitivity causes a decrease in an adhesive strength in response to an application of UV light. The handle includes a thickness of between 49 and 801 microns. The handle includes at least one side between 100 and 600 microns long. The handle includes at least one side between 300 and 800 microns long. The handle includes at least one side between 400 and 600 microns long.

In general, in an aspect, a method includes using a releasable layer to attach a handle substrate to a discrete component, and while the handle substrate is attached to the discrete component, using a tool to hold the handle substrate and cause the discrete component to contact an adhesive layer on the device substrate. The method also includes causing the releasable layer to release the handle substrate from the discrete component and causing the discrete component to become attached to the device substrate at the adhesive layer, and withdrawing the tool from the handle substrate while the handle substrate remains in contact with the discrete component through the released releasable layer.

Implementations may include one or a combination of any two or more of the following features:

The method includes removing the handle substrate from contact with the discrete component. Removing the handle substrate from contact with the discrete component includes applying at least one of the following: a brush, a blade, compressed air, a vacuum force, a vibration, or gravity force, or a combination of any two or more of them. The releasable layer is a thermally sensitive material. The releasable layer is an ultraviolet light sensitive material. The releasable layer comprises a first and a second layer. The releasable layer comprises a first layer attached to handle and a second layer oriented for discrete component deposition. The second layer is parallel to the first layer. The second layer is UV sensitive. The second layer is thermally sensitive. The first layer is permanent adhesive. The thermal sensitivity of the second layer causes a decrease in an adhesive strength in response to an application of thermal energy. The thermal sensitivity of the second layer causes an increase in an adhesive strength in response to an application of thermal energy. The UV light sensitivity causes an increase in adhesive strength in response to an application of UV light. The UV light sensitivity causes a decrease in adhesive strength in response to an application of UV light. Releasing the discrete component from the handle is contemporaneous with attaching the discrete component to the device substrate. Releasing the discrete component from the handle is in response to attaching the discrete component to the device substrate. Releasing the discrete component from the handle is caused by the attaching the discrete component to the device substrate. Releasing the discrete component from the handle is completed after attaching the discrete component to the device substrate. The discrete component is released from the handle through attaching the discrete component to the device substrate.

We describe here, among other things, new ways to package ultra-small and/or ultra-thin discrete components, for example, ultra-small and/or ultra-thin semiconductor dies that include integrated circuits that are temporarily attached to handle substrates such that the resulting assembly is compatible with standard electronics packaging equipment, for example, pick-and-place die bonders and other chip assembly equipment. Among other things, the methods and products that we describe can be relatively simple, inexpensive, effective, and compatible with current systems. In that respect, these methods and products will open new markets and expand current markets for technology including low-cost electronic devices.

We use the term discrete component broadly to include, for example, any unit that is to become part of a product or electronic device, for example, electronic, electromechanical, or optoelectronic components, modules, or systems, for example any semiconductor material having a circuit formed on a portion of the semiconducting material.

We use the term device substrate broadly to include, for example, any object that will receive the discrete component or to which the discrete component is assembled, for example, a higher level assembly, for example, a product or electronic device electronic, electromechanical, or optoelectronic components, or system.

We use the term handle, handle substrate, interim handle, or interim handle substrate broadly to include, for example, any rigid substrate, such as blank silicon wafers, glass or ceramic substrates, or substrates made of rigid polymers or composite materials, of a thickness exceeding the thickness of the discrete component for temporary use to transfer the discrete component to a device substrate and/or for temporary use to support one or more discrete components.

We use the term carrier or carrier substrate broadly to include, for example, any material including one or more discrete components, for example, a collection of discrete components assembled by a manufacturer, such as a wafer including one or more semiconductor dies.

With respect to a discrete component, we use the term ultra-thin broadly to include, for example, a discrete component having a thickness incompatible with general pick-and-place technology, for example, having a thickness less than or equal to 50 µm.

With respect to a discrete component, we use the term ultra-small broadly to include, for example, a discrete component having a size incompatible with general pick-and-place technology, for example, having a maximum length less than or equal to 300 µm/side.

With respect to a wafer, we use the term ultra-thin broadly to include, for example, a semiconductor wafer having a maximum thickness of less than or equal to 50 µm.

These and other aspects, features, implementations, and advantages can be expressed as methods, apparatus, systems, components, means or steps for performing functions, and in other ways and combinations of them.

These and other aspects, features, implementations, and advantages will become apparent from the following description, and from the claims.

DETAILED DESCRIPTION

We describe herein, among other things, new ways to package highly flexible and/or tiny (for example, imperceptible) discrete components. Such flexible and imperceptible discrete components are ultra-thin and/or ultra-small and provide the flexibility and low cost beneficial to a wide range of applications, but are also currently incompatible with conventional packaging techniques, e.g., pick-and-place equipment. Among other things, the methods and products we describe herein are optimized to handle such ultra-thin and/or ultra-small discrete components in combination with conventional pick-and place equipment. In that respect, these methods and products can result in a reduction in production cost of electronics products while supporting packaging rates higher than those possible with conventional discrete components and pick-and-place equipment.

Figure 1:
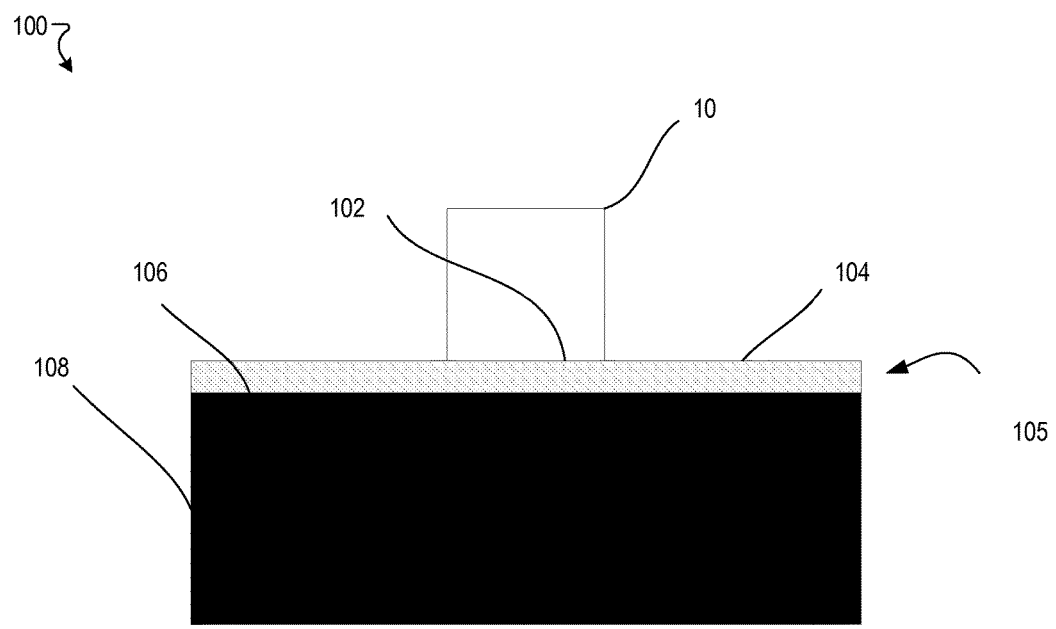
FIG. 1 is a schematic side view of a handle assembly including an ultra-small and ultra-thin bare discrete component and a handle substrate.

As shown in FIG. 1, a handle assembly 100 includes a discrete component 10 and a handle substrate 108. The discrete component 10 is formed to be ultra-thin having, for example, a maximum thickness of 50 µm or less, 40 µm or less, 30 µm or less, 25 µm or less, 20 µm or less, 10 µm or less, and 5 µm and less, to be ultra-small having, for example, a maximum length or width dimension less than or equal to 300 µm/side, 250 µm/side, 200 µm/side, 150 µm/side and 100 µm/side, or both ultra-thin and ultra-small. As such, the dimensions of the discrete component 10 render current mass integrated circuit packaging technologies, such as the mechanical pick-and-place systems, ineffective (due to, for example, physical limitations, prohibitive costs, inefficiency, and/or low production rates) if not wholly unable to package the discrete component 10 or similarly sized discrete components.

The discrete component 10 includes an active face 102, which includes an integrated circuit device. The active face 102 may also include a passivation layer (not shown). In FIG. 1, the discrete component 10 is oriented with the active face 102 facing the handle substrate 108. Such a configuration is advantageous if the discrete component is expected to be electrically connected to other components on the device substrate using means and materials commonly used for such a connection, for example, wire bonding, or tape automated bonding (TAB). The backside of the discrete component is bonded to the device substrates using means and materials commonly used for such an attachment, for example, bonding with eutectic alloys, solders, adhesives, such as conducting and non-conducting epoxies, polyamides, and other suitable materials and methods.

Figure 2:
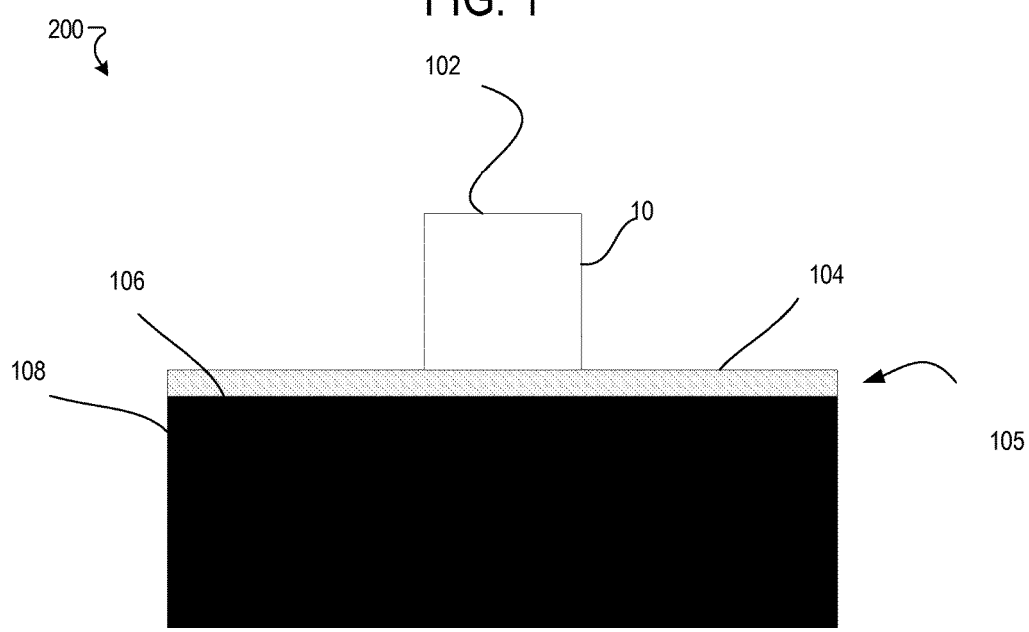
FIG. 2 is a schematic side view of a handle assembly including an ultra-small and ultra-thin bare discrete component and a handle substrate.

The integrated packing methods, as described below, are alternatively capable of producing a discrete component with an alternative active face orientation. For example, as shown in FIG. 2, a handle assembly 200 can include discrete component 10 with the active face 102 exposed or oriented away from the handle substrate 108. Such an orientation is advantageous if the discrete component 10 is expected to be electrically connected using the method referred to as a flip-chip assembly to components, for example, conductors on a device substrate, such as those shown, for example in FIG. 12.

In some implementations, the handle substrate 108, for example, a blank silicon wafer, glass, ceramics, or other inorganic or organic substance, extends beyond the discrete component 10 and is sized and configured to be compatible with current pick-and-place systems. In some cases, one or more circuits are placed on oversized handle substrate, and each individual handle is cut to size. Generally, the handle substrate 108 can have a length greater than or equal to 300 µm/side, preferably 400-600 µm/side, and thickness exceeding 50 µm, for example, a thickness greater than 50 µm, and between 100-800 µm. In these cases, while pick-and-place systems may be unable to effectively transfer the discrete component 10, the pick-and-place system will be able to transfer the discrete component 10 so long as the discrete component 10 is attached to the sufficiently sized and configured handle substrate. As such, however, standard deployment means of the pick-and-place system, for example, the absence of a vacuum force, are unable to release only the discrete component, but rather would release the handle and discrete component assembly. However, among other advantages, the characteristics of the attachment means and their relative relationship to each other, particularly between the discrete component, the handle substrate, and the device substrate, are selectable and customizable to release the discrete component from the handle substrate and attach it to the device substrate while the pick-and-place system retains control over the handle substrate.

Figure 3:
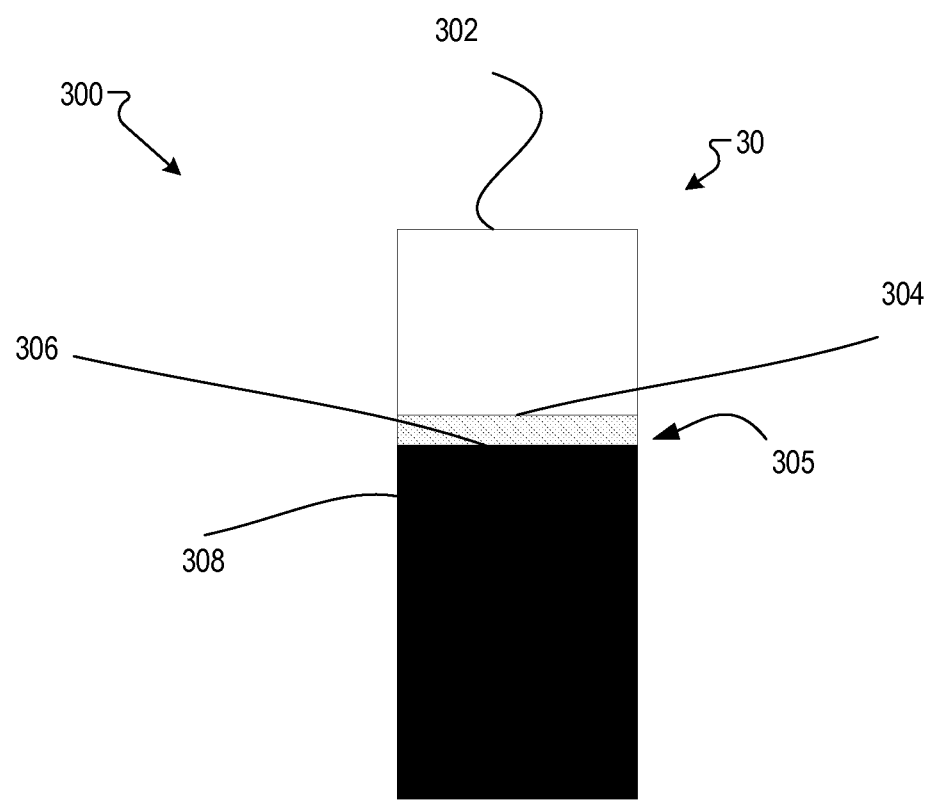
FIG. 3 is a schematic side view of a handle assembly including an ultra-thin bare discrete component and a handle substrate.

In some implementations, discrete component 30 can have a size but remain too thin for compatibility with current packaging technologies. In these cases, as shown in FIG. 3, a handle assembly 300 can include the ultra-thin discrete component 30 attached to a handle substrate 308 having a similar length to the discrete component 30. As such, the handle assembly 300 is thick enough for compatibility with pick-and place systems. The properties of a release layer 305 including a second surface 306 and a first surface 304 are generally similar to those described with reference to FIGS. 1 and 2.

In some examples, the double-sided release layer 105 is a composite of multiple sub-layers (e.g., a first layer and a second layer). The double-sided release layer 105 and one or more of the sub-layers (if any) can include one or more surfaces (such as an internal surface or an external surface). For example, referring again to FIG. 1, the discrete component 10 is releasably attached to the handle substrate 108 via an attachment to the release layer 105. The double-sided release layer 105 includes a first surface 104 exposed to the discrete component 10 and a second surface 106 exposed to the handle substrate 108. In some examples, the release layer 105 is a double-sided thermal- or UV-release tape known to be compatible with wafer mounting for wafer dicing or thinning. In such a tape, the second surface 106 includes a pressure-sensitive adhesive and the first surface 104 can include a UV-release material or a thermal-release material. Exemplary release materials that are compatible with semiconductor materials are known, and selectable based on the desired adhesion characteristics.

In other examples, the release layer 105 is a single layer such that the first surface 104 and the second surface 106 are the same material. Such materials can include, for example, spin-on thermal release materials for temporary wafer bond, for example, the Valtron® Heat Release Epoxy System by Valtech or the Logitech's OCON-196 Thin Film Bonding Wax. Other exemplary thermal release materials include the Ethylene Vinyl Acetate (EVA) copolymer films such as the WaferGrip adhesive films by Dynatex. Other exemplary materials include UV-release adhesives such as polymers with photofunctional groups that easily change their chemical structure when exposed to UV light energy.

In some cases, the bond strength between the release layer 105 and the discrete component 10 and between the release layer 105 and the handle substrate 108, for example, are each chosen so that when the discrete component 10 attaches first surface 104, the bond strength of that attachment is weaker than the bond strength between the second surface 106 and the handle substrate 108. The bond strength between the discrete component 10 and the first surface 104 could also be selected to be weaker than the bond strength between the discrete component 10 and a device substrate as described below. For example, in some cases the release layer 105 may be a material with a melting temperature lower than the temperature required to bond the discrete component 10 and a device substrate as described below first. Examples include wax or similar materials.

In other examples, the release layer 105 is chosen such that the adhesion mechanism of the first surface 104 is independently controllable relative to the attachment mechanism of the second surface 106. This arrangement helps to ensure that the discrete component 10 is selectably releasable from the handle substrate 108 without necessarily releasing the release layer 105 from the handle substrate 108.

In other cases, for example, the release layer 105 could alternatively or additionally include a double coated thermal release tape (such as a REVALPHA® double-coated thermal release tape by Nitto®) that includes a pressure sensitive adhesive layer and a heat-release adhesive layer. In some cases, the first surface 104 could include the heat-release adhesive layer while the second surface 106 could include the pressure sensitive adhesive. At least upon the application of thermal energy, the bond strength between the ultra-thin and ultra-small discrete component 10 and release layer 105 could be weaker as compared with the bond strength between the layer 106 and the handle substrate 108. As such, a force applied to the ultra-thin and ultra-small discrete component 10 away from the handle substrate, for example, a pulling and/or shear force away from the handle substrate, could remove the ultra-thin and ultra-small discrete component 10 freely from the handle 108 without also removing the release layer 105, which remains attached to the handle 108.

While the attachment means between the discrete component 10 and the handle substrate 108 is generally described as an adhesive tape, other arrangements would be possible. For example, vacuum or electrostatic forces could be used to form this attachment temporarily. As with the release layer 105, the attachment means and characteristics, such as bond strength, can be selected such that the bond strength between the discrete component and the substrate is greater than the bond strength between the discrete component and the handle as the discrete component is bonded with the substrate.

Figure 4:
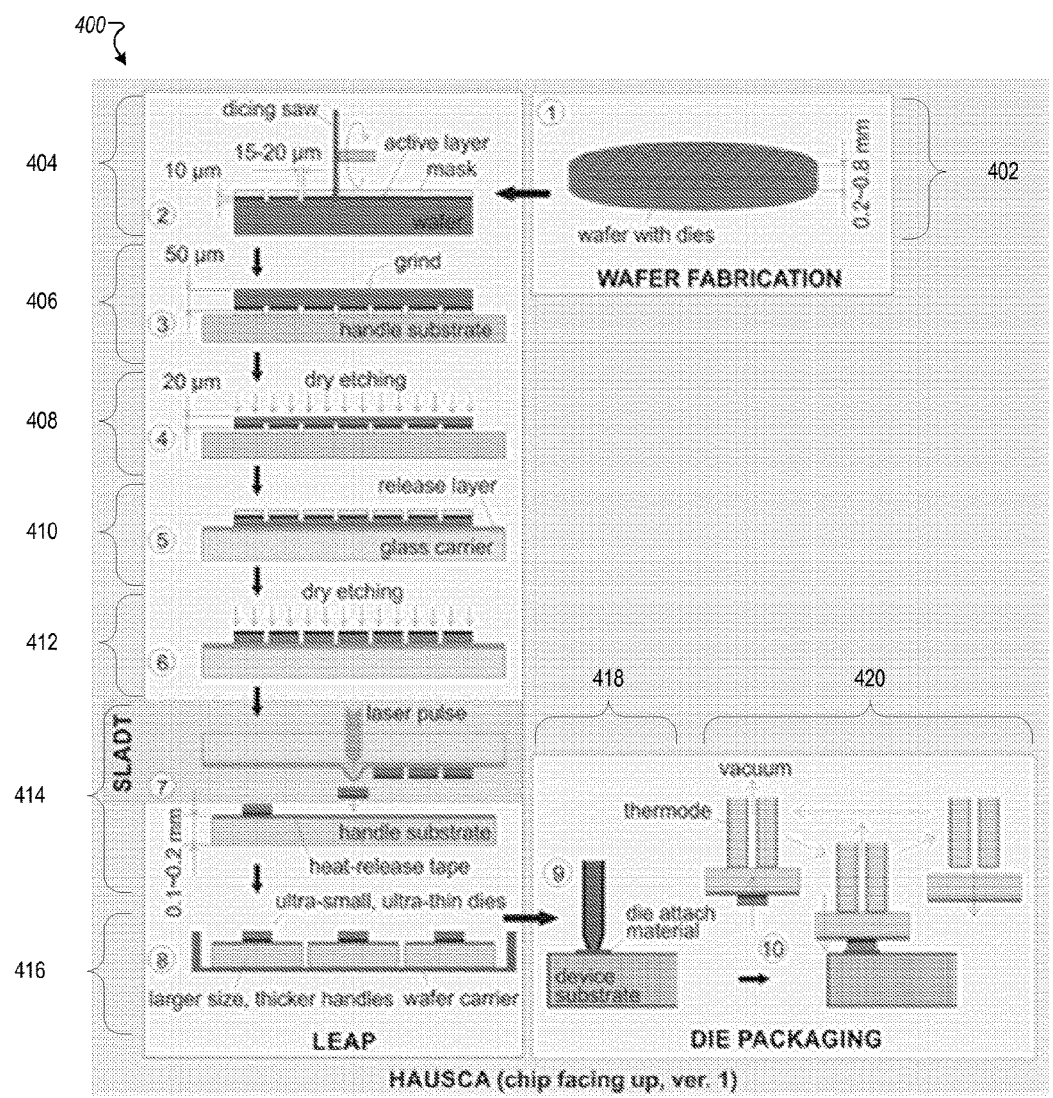
FIG. 4 is a schematic view showing an example of a discrete component packaging process using the handle assembly FIG. 1. The active face of the ultra-small and ultra-thin bare discrete component faces away from the device substrate.

As shown in FIG. 4, a process 400 for packaging ultra-small and ultra-thin discrete components can generally include discrete component fabrication (402), wafer preparation (404-412), discrete component transfer (414), handle substrate attachment and dicing (416), attachment site preparation (418), and discrete component bonding (420).

In general, wafers bearing large numbers of discrete components can be fabricated using known semiconductor techniques such as thin-film methods on a semiconductor material, for example, on a bulk silicon substrates or on layered silicon-insulator-silicon substrates (402).

The wafers can undergo partial dicing (404) using known semiconductor techniques. For example, the discrete components can be partially separated by dry or wet etching, by mechanical sawing (as shown in FIG. 4), or by laser micromachining. The wafer surface can be protected from damage with a masking film and/or a passivation layer. For example, a layer of photoresist, polymers, UV-curable polyimide, laminating films, or another suitable material can be applied and patterned using methods of photolithography or stencil/screen printing.

The masking film can be formed in accordance with known semiconductor techniques and materials such as by applying photoresists, to the wafer. The thickness and composition of the masking film material are selected in view of anticipated processing steps downstream from the wafer fabrication. For example, the thickness and composition of the masking film is selected such that that the masking film is removed, for example during an etching process (410) (as described below), after the streets are opened.

The depth of the removed material in the wafer streets can be selected based on the anticipated attachment process and the desired final thickness of the assembled discrete component. For example, in a discrete component face-up process used to form the handle assembly 100 as shown in FIG. 1, the depth of wafer streets is less than the desired final discrete component thickness, preferably greater than 1 μm and less than ½ of final discrete component thickness. The street width is selectable based on the method of dicing, for example, in view of the accuracy and precision of the dicing method.

In some implementations, transferring the discrete component to a device substrate can include the steps as follows.

Generally, forming an ultra-thin discrete component includes first forming a thin wafer (406-408), for example, a thin wafer having a thickness of 50 μm or less, 40 μm or less, 30 μm or less, 20 μm or less, 10 μm or less, and 5 μm or less. The thickness of the wafer can be reduced or thinned based on the desired final discrete component dimensions through known semiconductor thinning techniques, for example mechanical grinding, chemical mechanical polishing (CMP), wet etching, atmospheric downstream plasma etching (ADP), dry chemical etching (DCE), vapor-phase etching, or any combination thereof, e.g., mechanical grinding followed by chemical-mechanical polishing.

In some instances, the wafer can be thinned to a thickness of approximately 50 μm using a mechanical grinding technique such as backgrinding. However, in general, as the wafer thickness decreases, the wafer becomes more susceptible to damage by a mechanical grinding due to the fragility of the thin wafer. To reduce the risk of damaging the wafer, a noncontact material removal process can be used to reduce the wafer thickness beyond what is achievable by the conventional mechanical grinding process. For example, to achieve a wafer thickness of 20 μm or less, a known noncontact material removal process, such as Reactive Ion Etching (RIE), vapor phase etching, or any other appropriate processes can be used to produce the thin wafer.

Wafer thinning to 20 μm or less can be accomplished by only mechanical backside grinding followed by polishing using the proprietary 3M Wafer Support System®. In this case, the additional thinning by a noncontact material removal process is not necessary.

Prior to and during the wafer thinning, the wafer can be attached to a temporary handling substrate (406-408). The temporary handling substrate releasably adheres to the wafer and is removable without damaging the wafer. For example, the temporary handling substrate can include a semiconductor tape such as a thermal-release tape (for example, ELEP Holder® by Nitto), or ultraviolet-release tape, or can include a wafer handling fixture that is configured to releasable connect to the wafer using a vacuum force, electrostatic forces, or other appropriate means of handling thin wafers. The thermal-release tape or ultraviolet-release tape is selected such that the tape adheres to the wafer, but is removable either by the application of heat or UV respectively. In some cases, the temporary handling substrate can be a laser transparent interim handle (410-412), for example, a glass interim handle using a dynamic releasing layer (which we call DRL), disclosed in PCT WO2012/033147, which is incorporated here by reference in its entirety.

As discussed above, the discrete components are formed by the separation of portions of the semiconductor material from the wafer, for example, along the streets formed in the wafer. As shown in FIG. 4, individual discrete components can be released from the wafer using a dry etching technique, for example, RIE is used (410-412). As described above, the parameters and plasma gas composition are selected such that the silicon in the streets is completely etched or removed (410) prior to etching or removing any other mask material (412). For example, a photoresist material and thickness can be selected, depending on the process parameters and plasma gas compositions if a RIE is used. In this case, the parameters and plasma gas composition are selected such that the silicon in the streets is completely etched or removed prior to etching or removing any other mask material. In some cases, process parameters include a 1:1 mix of $SF_6$ and $O_2$ as a plasma gas, pressure 13-14 Pa, power 135 W, and DC-bias 150 V. In this example, after the streets are opened, etching continues until the masking layer is completely removed from the discrete component surface.

Releasing the individual discrete components from the handling substrate will depend upon the handling substrate material and/or adhesive material used. As described above, the discrete components, for example, are mounted to a glass interim handle using a DRL layer. In this case, the discrete components can be released from the DRL using a laser transfer method (414) without contacting the ultra-thin discrete component. Other methods than can handle ultra-thin discrete components can be used to transfer the discrete components to the handle substrate.

Figure 5:
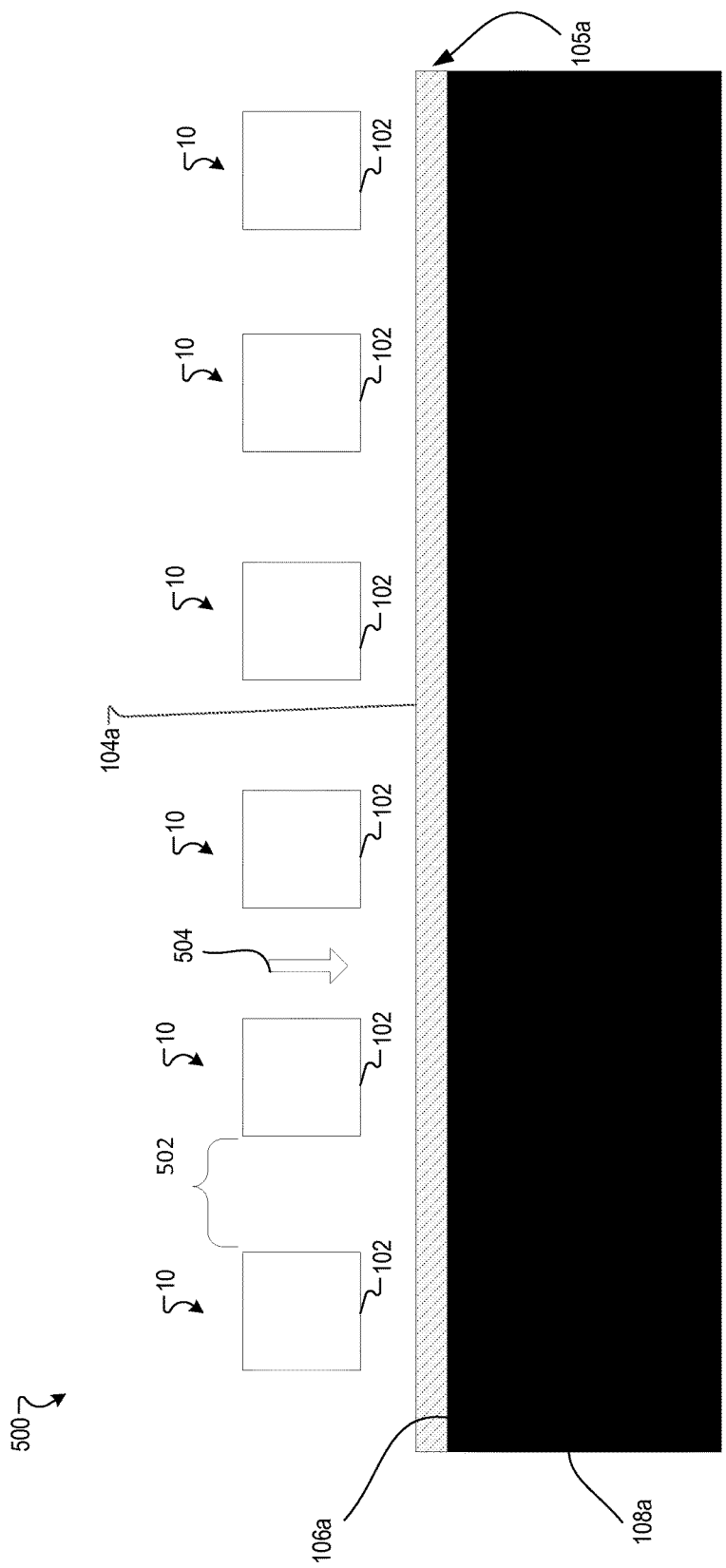
FIG. 5 is a schematic side view of a handle substrate prior to an attachment with a discrete component.

Referring to FIGS. 4 and 5, the discrete components can be released from the DRL layer and attached to a handle substrate by using a laser contactless technology (414) for ultra-thin chips assembly (which we call SLADT), disclosed in PCT WO2012142177, which is incorporated here by reference in its entirety. A distance 502 between each discrete component 10 is selectable based on the capabilities of the wafer dicing tool, for example, kerf and precision, dimensions of the ultra-small and ultra-thin discrete component 10, and dimensions of the handle 108. Suitable wafer dicing tools and/or methods include sawing, laser cutting, scribing, stealth dicing, and other known suitable methods. In some examples, the distance 502 is greater than 50 μm, for example, inclusive of and between 50 μm and 200 μm. Prior to forming the individual handle assemblies, for example, the handle assembly 100, one or more discrete components 10 are released onto an oversized handle substrate 108a to form an oversized handle assembly 500. In some cases, the oversized handle assembly is positioned below the glass interim handle so that when the discrete components are released, each discrete component travels in a direction generally indicated by arrow 504 towards a release layer 105a, which is pre-coated, for example, using any suitable process such as lamination or spin coating, onto the handle substrate 108a. The properties of the handle substrate 108a, the release layer 105a including a second surface 106a and a first surface 104a are generally similar to those described with reference to the handle assembly 100, with the exception of the increased size of the handle substrate 108a and associated release layer 105a.

As such, in some implementations, the second surface 106a includes a pressure activated adhesive for attachment of the release layer 105a to the handle substrate 108a and the first surface 104a includes a thermal-release surface or a UV release surface, for example, a thermal-release layer or a UV-release layer for attaching the discrete component 10 to the release layer 105a. Thus, as the discrete component comes into contact with the release layer 105a, the discrete component is releasably attached to the handle substrate 108a, until, for example, an application of heat or UV light.

In other examples, the release layer 105a is a single layer such that the first surface 104a and the second surface 106a are the same material, for example, a thermal release adhesive or a UV-release adhesive.

As described elsewhere, the methods described herein are used to attach ultra-thin and/or ultra-small bare discrete components to any device substrate used in integrated circuit packaging, such as a printed circuit board, plastic casing, ceramic substrate, flexible circuit, or other device substrates. Prior to attaching the discrete components to a device substrate, for example a device substrate 604, attachment means for the discrete component can be provided. For example, as shown in FIG. 4, a thermally cured non-conductive discrete component attachment material (such as Ablebond 8008NC by Henkel) can be dispensed to form an adhesive surface 608 for the discrete component to attach to device substrate 604 (418).

Figure 6:
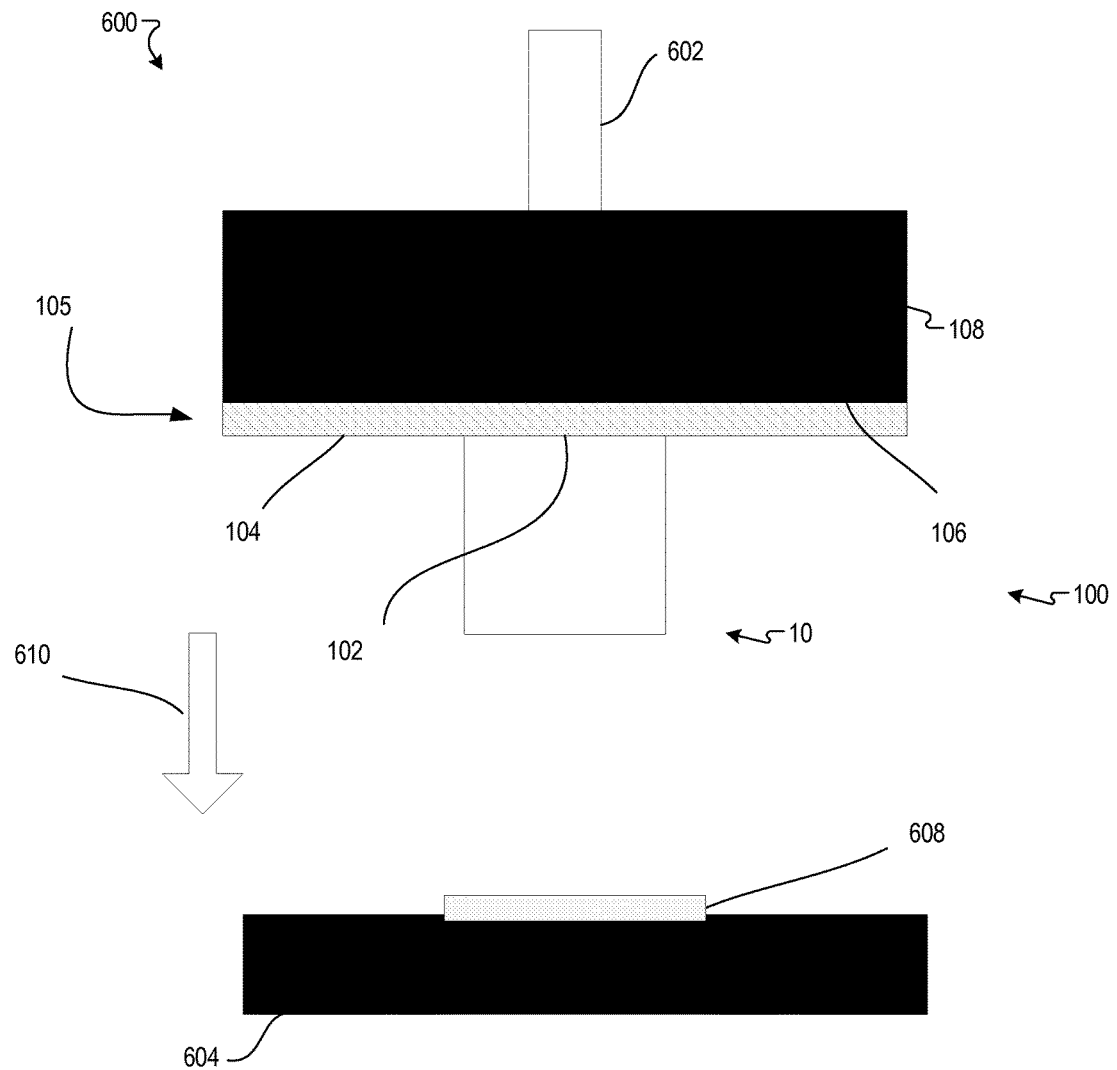
FIG. 6 is a schematic side view of the transfer assembly and device substrate assembly.

Referring to FIGS. 4 and 6 a transfer 600 to a device substrate can include, for example, a discrete component bonding tool 602, a handle assembly 100, and a device substrate 604. In some implementations, the discrete component bonding tool 602 attaches to the handle substrate 108 of the handle substrate assembly 100. The discrete component bonding tool 602 moves towards the device substrate and positions the discrete component 10 directly over the attachment surface 608 on the device substrate 604. The discrete component bonding tool 602 then moves the handle assembly 100 toward the device substrate, for example, in a direction generally show by an arrow 610, until the discrete component 10 contacts the adhesive surface 608. Once contact is made, the discrete component bonding tool applies a force and temperature profile that can cure the adhesive on the adhesive surface 608. Because the discrete component 10 is attached to the handle substrate assembly through a thermal-release layer, temperature profile delivered to the adhesive on the adhesive surface 608 quickly or simultaneously weakens the adhesion between the discrete components 10 from the handle substrate 108. Any remaining bond strength between the handle substrate 108 and the discrete component 10 is insufficient to overcome the bond strength between the discrete component 10 and the device substrate 604. As a result, the discrete component 10 remains attached to the device surface as the discrete component bonding tool 602 and handle substrate move away from the device substrate. The handle substrate can subsequently be released from the discrete component bonding tool for disposal at a different location by applying a positive pressure through the discrete component bonding tool.

If the handle substrate includes a UV releasable layer (104) than a thermal release layer, the transfer means, for example, the discrete component bonding tool 602, can be facilitated with a device that is capable of emitting UV light. As with the thermal-release discrete component bonding tool, the UV-release discrete component bonding tool can emit UV light with sufficient intensity to de-bond the discrete component from the handle. In this case, an additional heat source is required to bond the discrete component to the device substrate. Such a heat source can be integrated with the work table that holds the device substrate.

In certain implementations, the discrete component can be bonded to the handle substrate by a UV releasable layer while the adhesive on the device substrate can be a UV-cured adhesive material. In this case, emitting a UV light of a sufficient intensity, based on the chosen adhesives, can weaken the bond between the discrete component and the handle substrate and bond the discrete component to the adhesive on the device substrate.

In some examples, various combinations of thermally sensitive or UV sensitive adhesives are used such that the bond between the discrete component and the handle substrate weakens while the bond between the discrete component and the device substrate strengthens.

In some cases, heat or UV light are also or alternatively applied through the device substrate to cure the adhesive on the device substrate.

In some implementations, transferring the discrete component to a device substrate can include the steps as follows.

Figure 7:
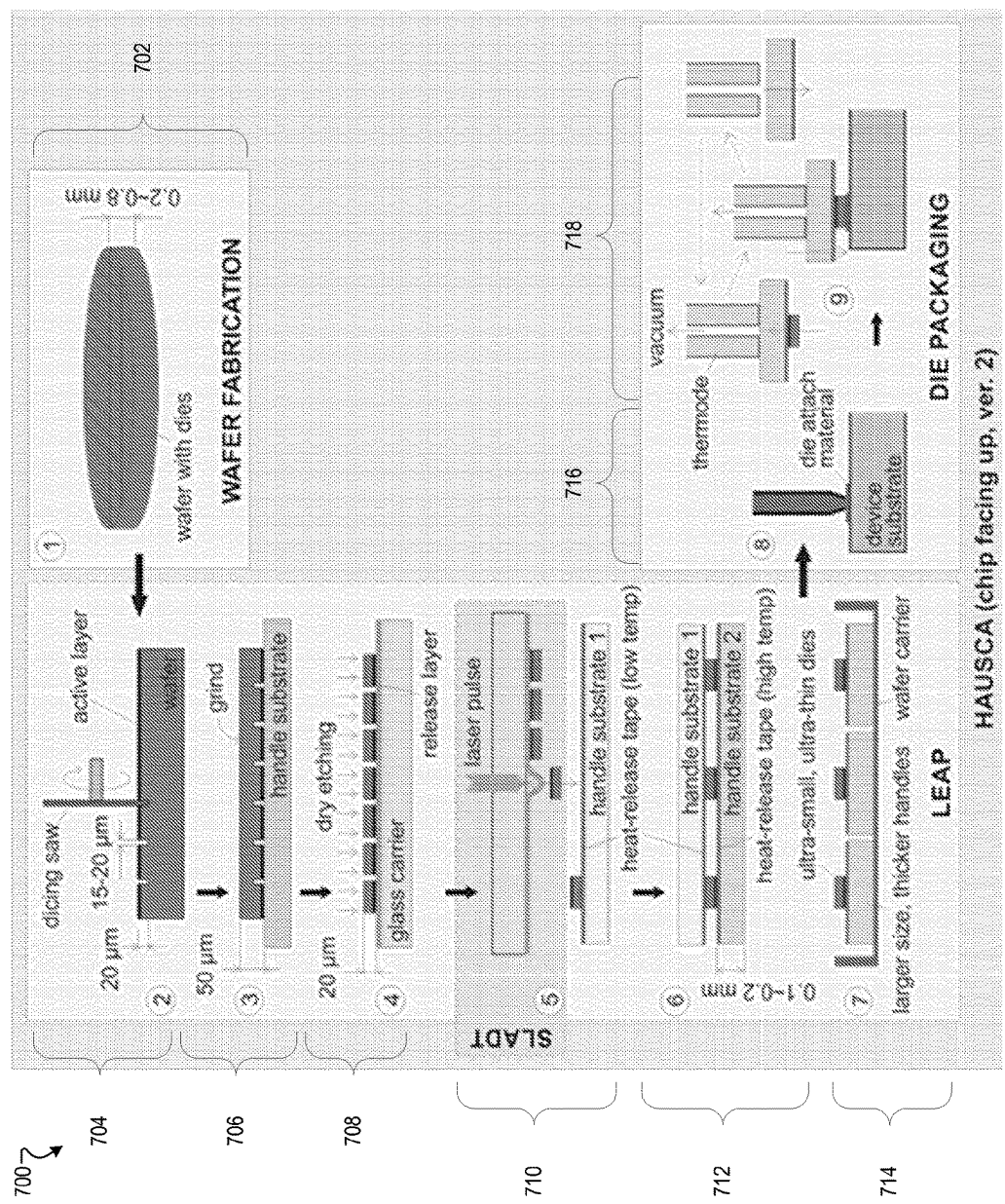
FIG. 7 is a schematic view showing another example of a discrete component packaging process using the handle assembly FIG. 1. The active face of the ultra-small and ultra-thin bare discrete component faces away from the device substrate.

As shown in FIG. 7, a process 700 for packaging ultra-small and/or ultra-thin discrete components in a face up configuration can generally include obtaining or fabricating a wafer (702), partially dicing the wafer (704), thinning the wafer (706), separating the discrete components from the wafer (708), transfer the discrete components from the wafer to an interim handle substrate (710), transfer the discrete components from the interim handle substrate to the handle substrate (712), bonding the discrete components to the handle substrate while weakening the bond between the interim handle substrate and the discrete components (712), dividing the handle substrate into a plurality of individual handle substrates each including a discrete component (714), preparing the device substrate for attachment with the discrete component (716), picking up the handle assembly using a discrete component bonding tool and positioning the handle assembly over the device substrate to align the discrete component with the attachment adhesive on the device substrate (718), moving the discrete component into contact with the attachment adhesive on the device substrate (718), emitting energy such that the bond between the discrete component and the handle substrate weakens while the bond between the discrete component and the device substrate strengthens (718), moving the discrete component bonding tool away from the device substrate while the discrete component remains bonded to the device substrate (718), and releasing the handle substrate from the discrete component bonding tool (718).

In general, wafers bearing large numbers of discrete components can be fabricated using known semiconductor techniques such as thin-film methods on a semiconductor material, for example, on bulk silicon substrates or on layered silicon-insulator-silicon substrates (702).

During dicing (704) the wafers can undergo partial dicing using known semiconductor techniques. For example, the discrete components can be partially separated by dry or wet etching, by mechanical sawing (as shown in FIG. 7), or by laser cutting. In certain cases, the wafer is diced to form street depth equal or slightly greater than the final discrete component thickness.

In some implementations, wafer thinning, discrete component separation are generally similar to the wafer thinning, and discrete component separation described with reference to the process 400 except for any discussion related to a masking film. For example, the process 700 omits a masking film so the dry etching (708) is simply carried out until the streets are unobstructed.

Figure 8:
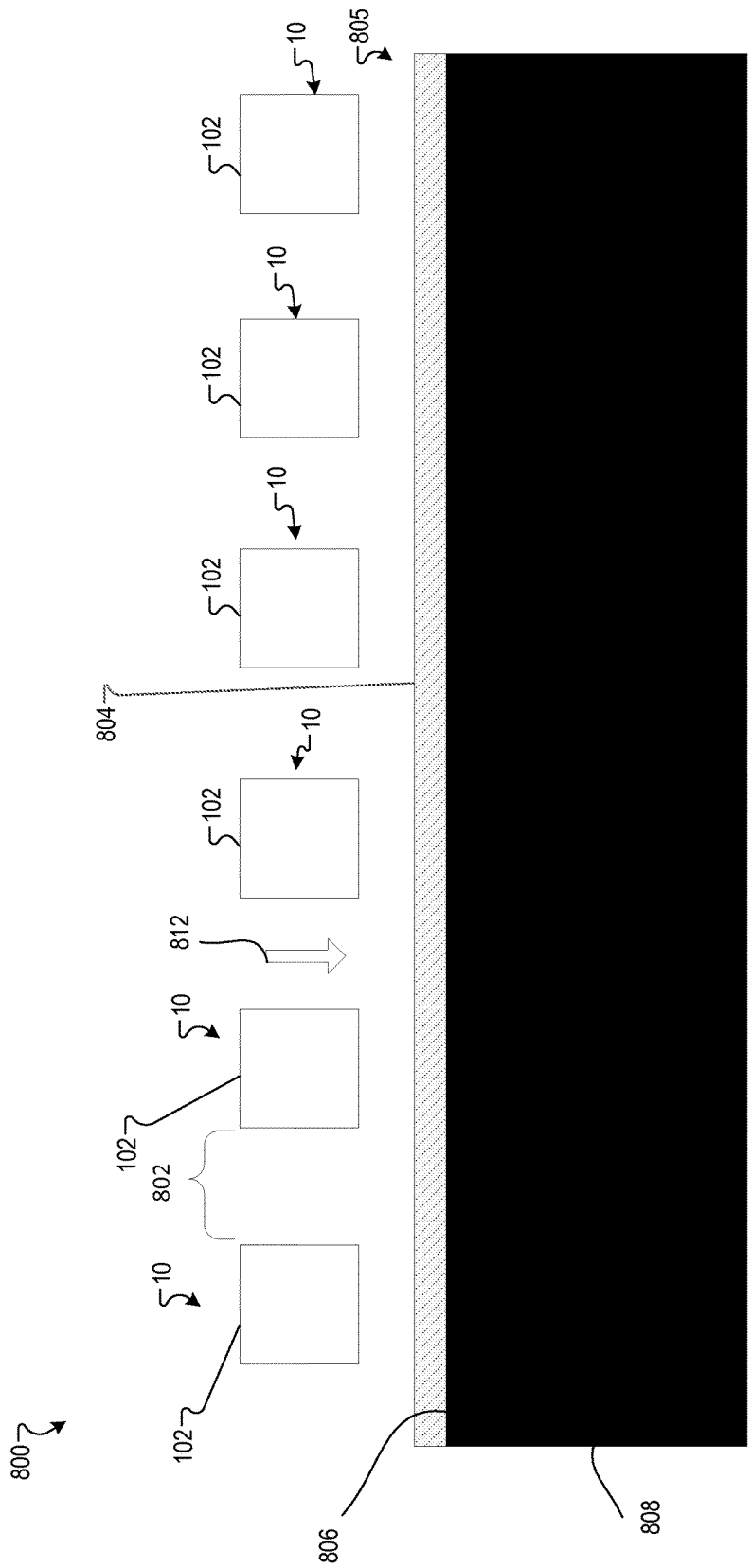
FIG. 8 is a schematic side view of a handle substrate prior to an attachment with a discrete component.

While the process of transferring the discrete components from the wafer (710) is generally similar to the process described with reference to the process 400, here discrete components are first transferred to an interim substrate handle 808 along a direction 812, with each discrete component 10 separated by a distance 802. Referring to FIG. 8, an oversized handle assembly 800 is generally similar to the oversized handle assembly 500, with the exception of the location of the active discrete component face 102 and the type of release layer 805. Here, the active discrete component face is oriented away from the interim substrate 808. Further, the interim substrate 808 is coated with a low-temperature adhesive heat-release tape so that when the tape is exposed to a certain temperature, the tape loses its adhesive properties. For example, REVALPHA 319Y-4L by Nitto® has a release temperature of 90° C.

Figure 9:
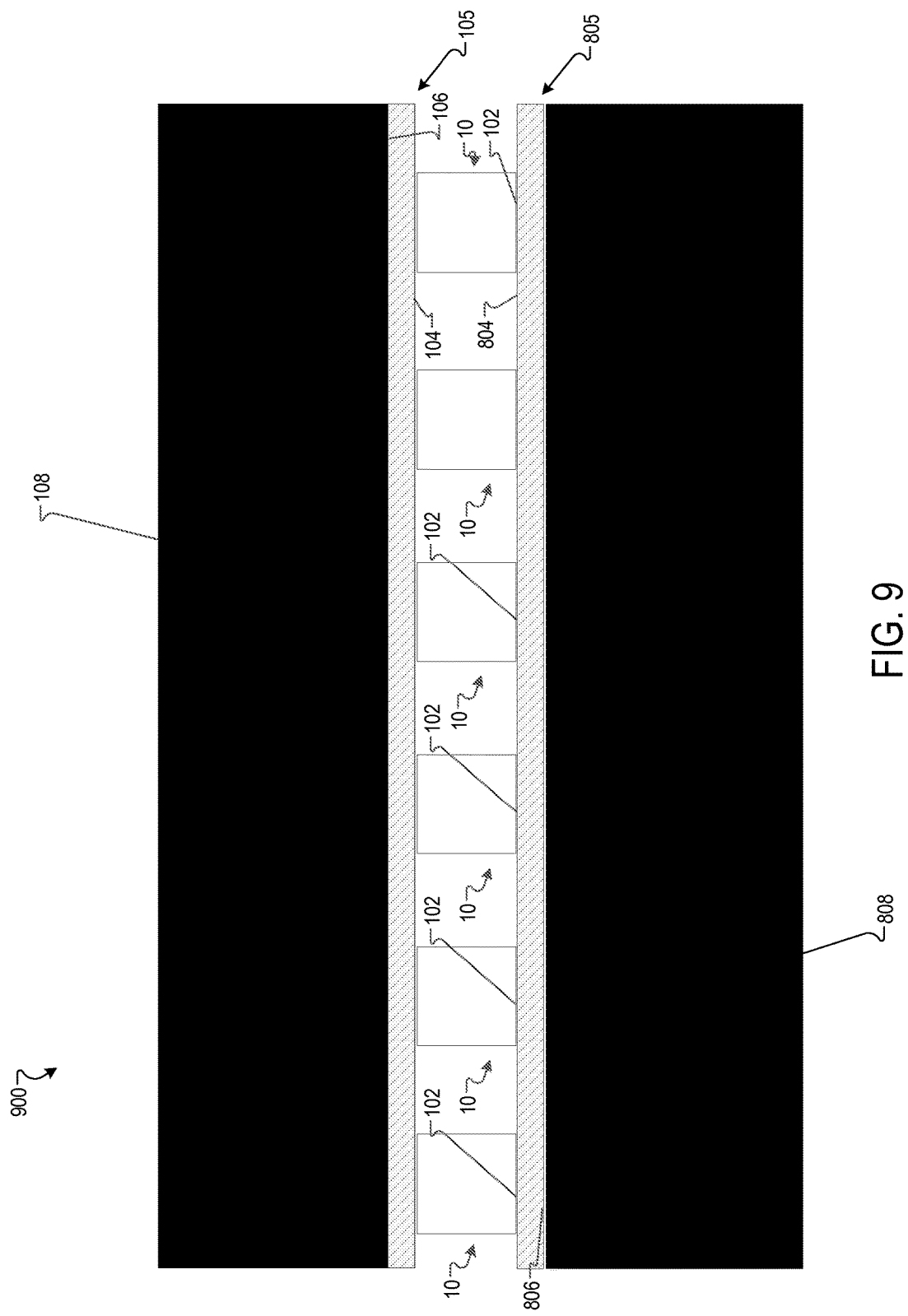
FIG. 9 is a schematic side view of a multi-handle substrate assembly.

Referring to FIG. 9, to transfer the discrete components from the interim handle substrate 808 to the handle substrate 108, the interim handle substrate 808 is placed over or stacked on the handle substrate 108. In this case, the handle substrate 108 includes release layer 105 including a layer 104 that heat sensitive with a higher release temperature, for example, REVALPHA 319Y-4H by Nitto® with a release temperature of 150° C., than the release temperature of the interim handle substrate. To weaken the bond between the discrete components and the interim handle substrate, the stack is heated to a temperature higher than the release temperature of the low-temperature tape but lower than the release temperature of the high-temperature tape. The conditions result in the interim handle substrate 808 losing adhesion. As such, the interim handle substrate is freely removable. In some cases, the interim substrate assembly is also reusable.

The discrete component packaging process including preparing the device substrate (716) and transferring the discrete component to the device substrate (718) is generally similar to the discrete component packaging process described with respect to FIG. 4.

Figure 10:
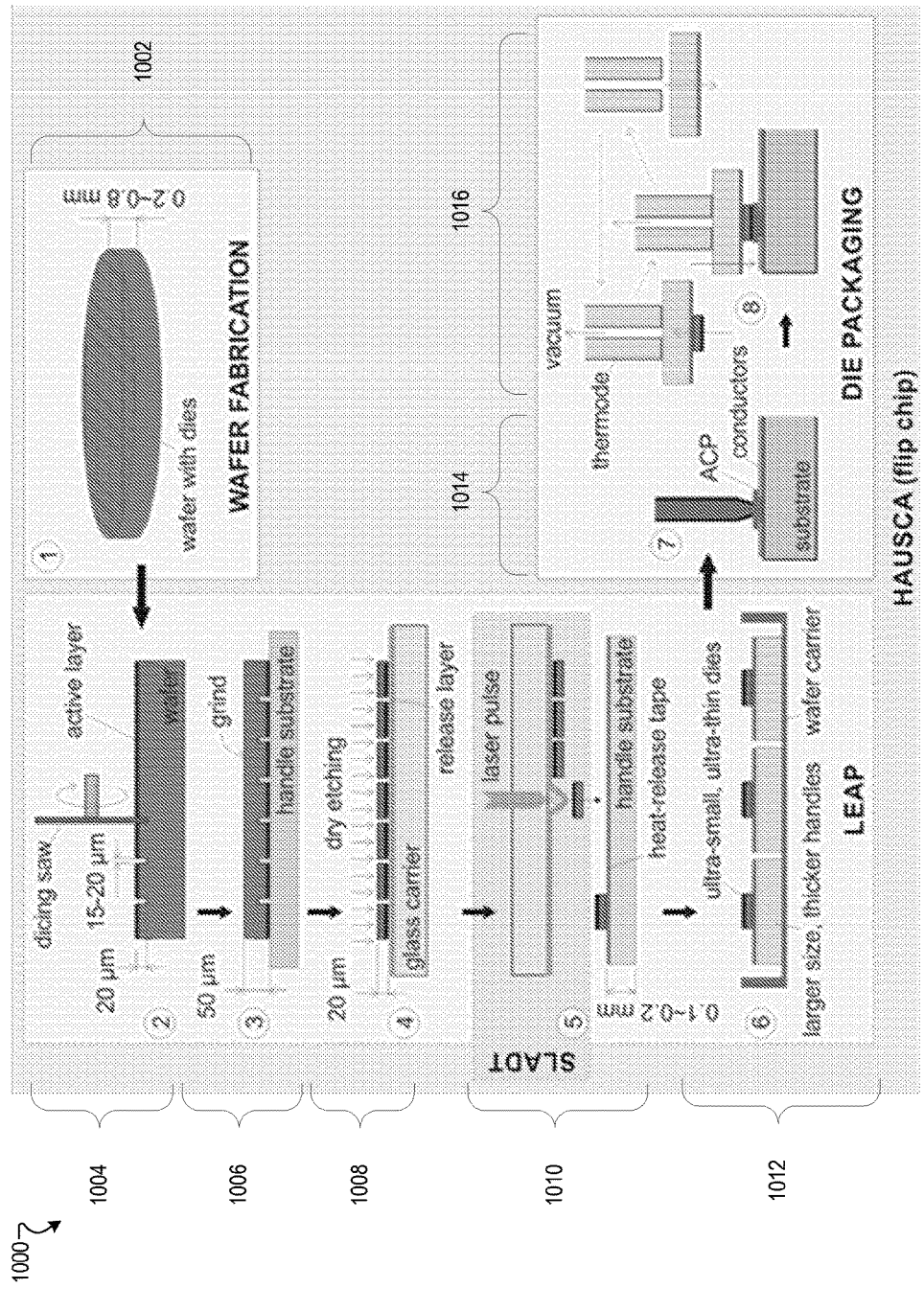
FIG. 10 is a schematic view of showing an example of discrete component packaging process using the handle assembly FIG. 2. The active face of the ultra-small and ultra-thin bare discrete component faces toward the device substrate.

As shown in FIG. 10, a process 1000 for packaging ultra-small and ultra-thin discrete components in a flip-chip configuration can generally include obtaining or fabricating a wafer (1002), partially dicing the wafer (1004), thinning the wafer (1006), separating the discrete components from the wafer (1008), transfer the discrete components to a handle substrate (1010) dividing the handle substrate into a plurality of individual handle substrates each including a discrete component (1012), preparing the device substrate for attachment with the discrete component (1014), picking up the handle assembly using a discrete component bonding tool and positioning the handle assembly over the device substrate to align the discrete component with the attachment adhesive on the device substrate (1016), moving the discrete component into contact with the attachment adhesive on the device substrate (1016), emitting energy such that the bond between the discrete component and the handle substrate weakens while the bond between the discrete component and the device substrate strengthens, (1016) moving the discrete component bonding tool away from the device substrate while the discrete component remains bonded to the device substrate, and releasing the handle substrate from the discrete component bonding tool (1016).

In general, wafers having bumped out discrete components, as required by a flip-chip configuration, are generally known. Common methods for wafer bumping include stud bumping, electroless nickel-gold plating, solder balls, solder paste printing, solder electroplating, etc. While an initial wafer having a low profile electroless nickel-gold plating is compatible with the process described here, the creation of bumps can occur after transferring the discrete components from the glass substrate (1010) and before placing the discrete components on the handle substrate (1012).

Figure 11:
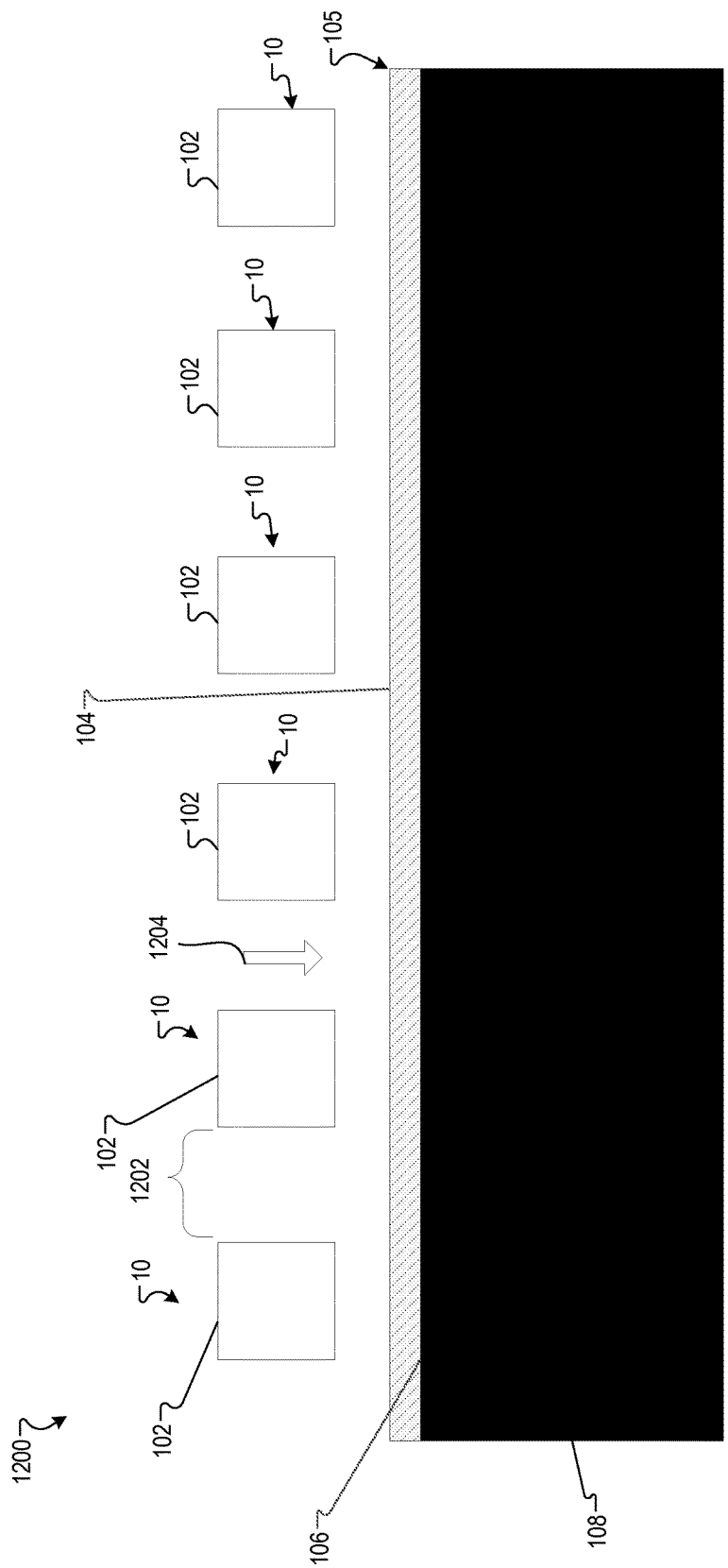
FIG. 11 is a schematic side view of a transfer assembly and device substrate assembly.

The wafer dicing process (1004), the wafer thinning process (1006), the discrete component separation (1008), the discrete component transfer (1010), forming individual handle substrates (1012), and discrete component bonding (1016) are generally similar to other methods discussed above. For example, the discrete components 10 are placed on the handle substrate 108, as shown in FIGS. 5 and 11, in the same manner but for the orientation of the active face 102 on the discrete component 10. Here, each of the discrete components 10 are separated by a distance 1202 and travel along a direction 1204.

Figure 12:
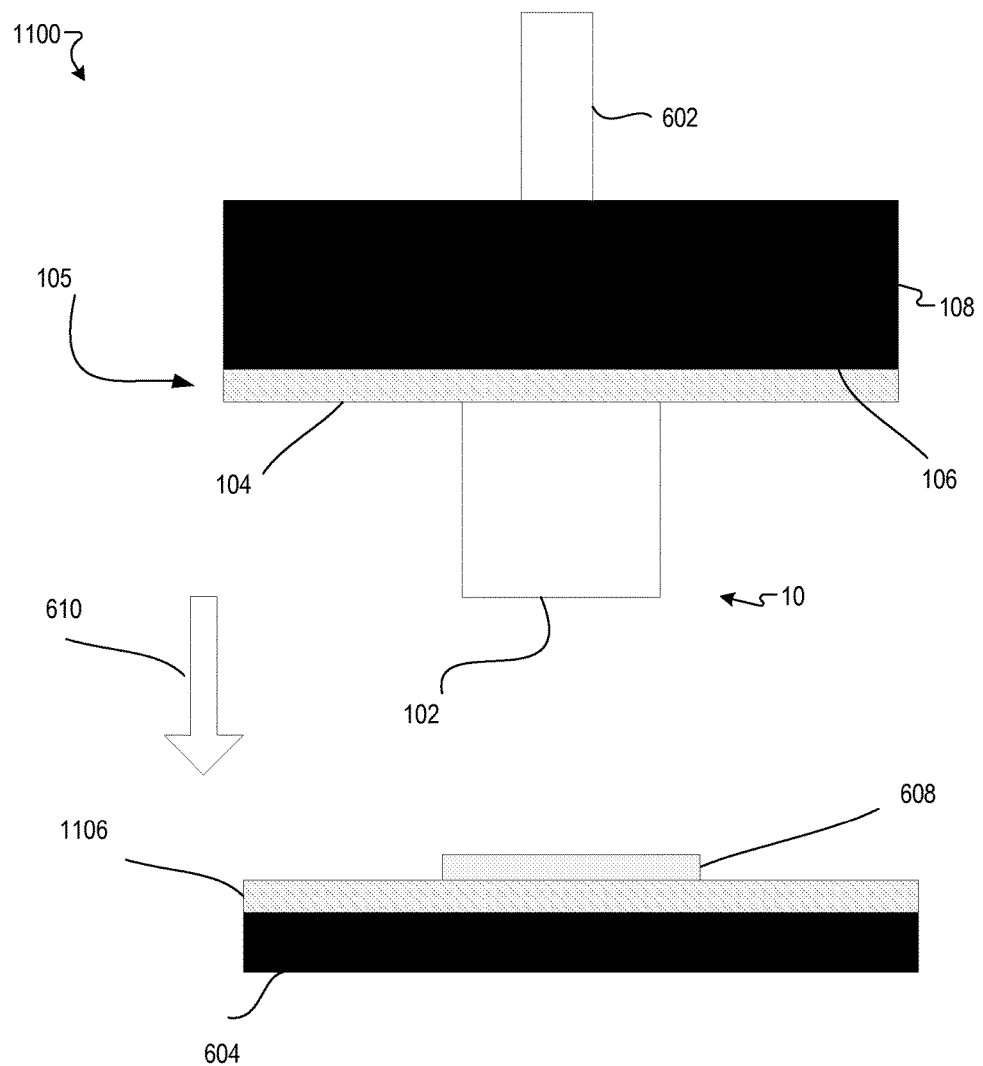
FIG. 12 is a schematic side view of a handle substrate prior to an attachment with a discrete component.

Referring to FIGS. 10-12, the discrete component 10 is attached to the device substrate 608 using electrically conductive materials 1106 and an adhesive material 1108.

The types of adhesive materials and application methods depend on the method selected to connect the discrete component electrically to the conductor traces on the device substrate. For example, conductive adhesives in a liquid form (e.g., anisotropic conductive adhesive, ACP, for example, type 115-29 by Creative Materials) or other commonly used methods and materials, for example, anisotropic conductive films and pastes, isotropic conductive films and pastes, and solders can be used. The discrete component bonding generally includes picking up the handle assembly using a discrete component bonding tool and positioning the handle assembly over the device substrate to align the discrete component with the attachment adhesive on the device substrate (1016), moving the discrete component into contact with the attachment adhesive on the device substrate (1016), emitting energy such that the bond between the discrete component and the handle substrate weakens while the bond between the discrete component and the device substrate strengthens, (1016) moving the discrete component bonding tool away from the device substrate while the discrete component remains bonded to the device substrate, and releasing the handle substrate from the discrete component bonding tool (1016).

In certain implementations, if adhesion methods beyond ACP bonding are used, it is desirable to customize the site preparation mechanisms and/or process (1014) to accommodate for the new material.

Figure 13:
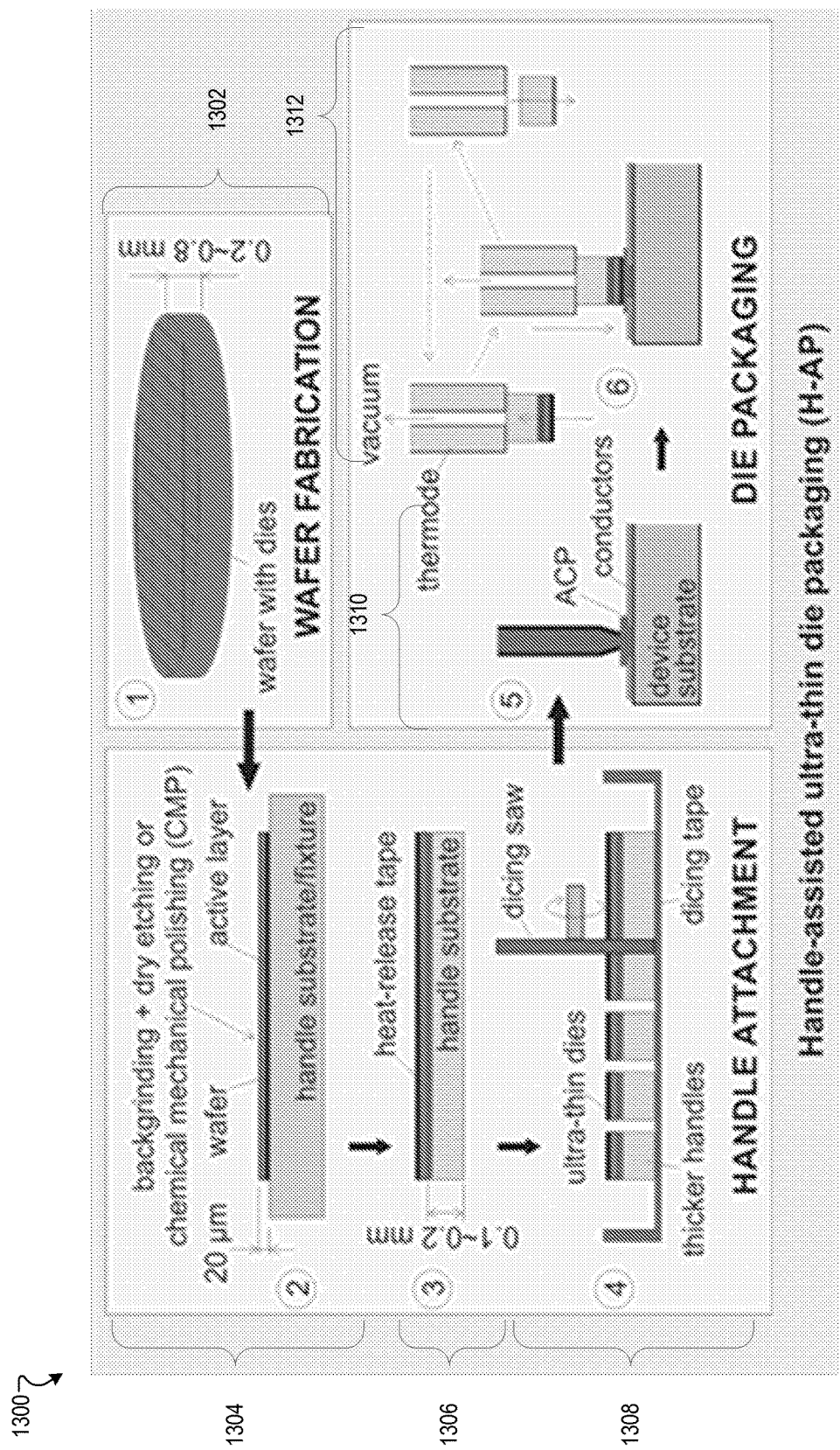
FIG. 13 is a schematic view showing an example of a discrete component packaging process using the handle assembly FIG. 3. The active face of the ultra-thin bare discrete component faces toward the device substrate.
Figure 14:
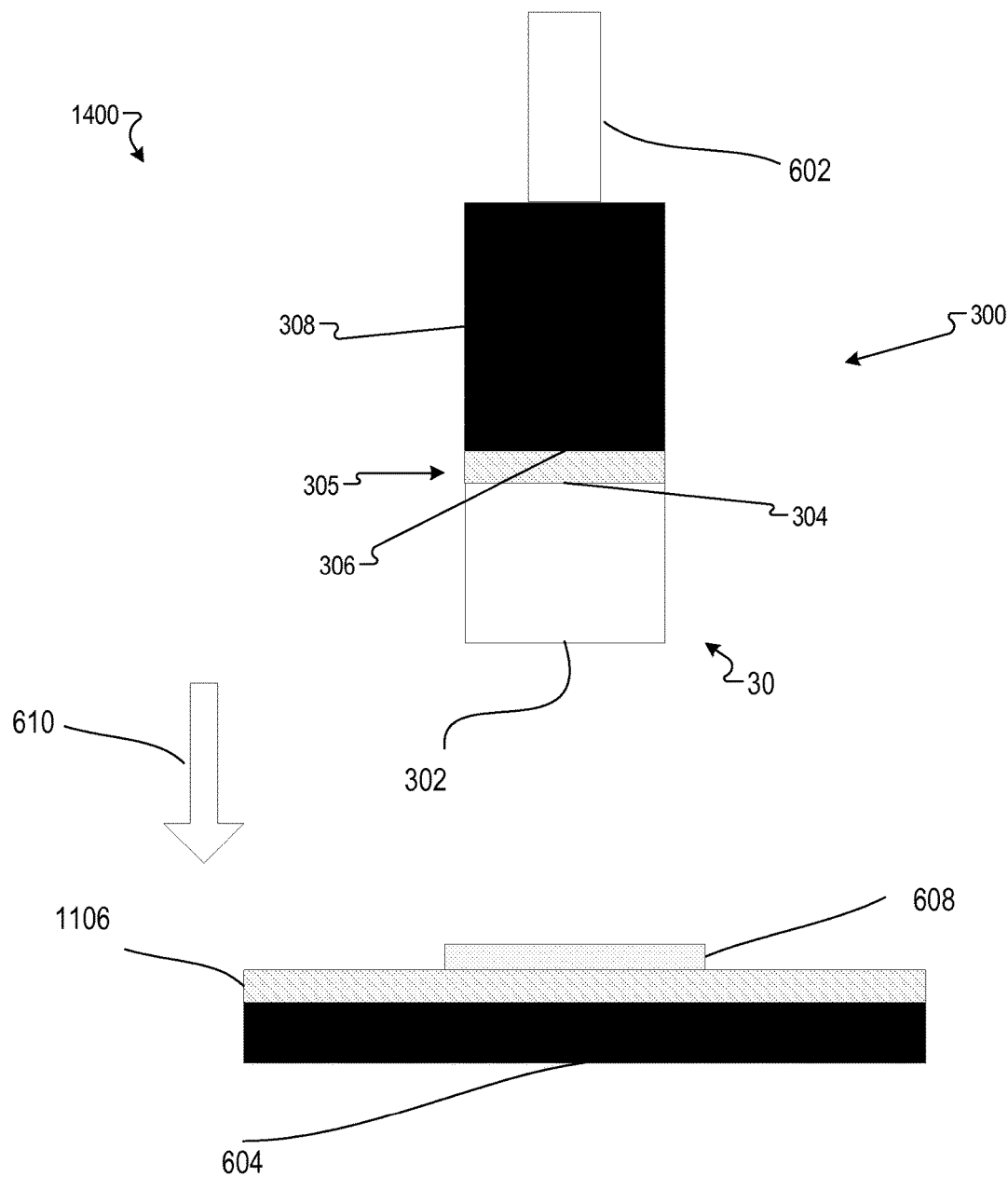
FIG. 14 is a schematic side view of a transfer assembly and device substrate assembly.

As shown in FIG. 13, a process 1300 for packaging an ultra-thin discrete component in a flip-chip configuration can generally include obtaining or fabricating a wafer (1302), thinning the wafer using a mechanical thinning process or a mechanical thinning process followed by a non-contact thinning process (1304), mounting the ultra-thin wafer to a handle substrate (1306), separating the discrete components from the wafer (1308), preparing the device substrate for attachment with the discrete component (1310), picking up the handle assembly using a discrete component bonding tool and positioning the handle assembly over the device substrate, as also shown in FIG. 14, to align the discrete component with the attachment adhesive on the device substrate 608, moving the discrete component into contact with the attachment adhesive 604 on the device substrate 608, emitting energy such that the bond between the discrete component and the handle substrate weakens while the bond between the discrete component and the device substrate strengthens (1312), moving the discrete component bonding tool away from the device substrate while the discrete component remains bonded to the device substrate, and releasing the handle substrate from the discrete component bonding tool (1312).

As with other flip-chip configurations, the discrete component is attached to the device substrate 608 using electrically conductive materials 604

Generally, the wafer formation (1302) and wafer thinning by contact or non-contact material removal processes (1304) are generally similar to process described elsewhere. However, the singulation of the individual discrete component and sizing of the handle substrate (1308) are somewhat streamlined in certain cases. For example, the release layer 305 including a second surface 306 and a first surface 304 is applied along handle substrate with a thermal or UV-release layer exposed to the backside of the ultra-thin wafer and the pressure sensitive layer attached to the handle substrate (1306). In this case, the length and width of the handle substrate 308 can be equal to the dimensions of the ultra-thin discrete component 30. As such, the handle substrate and wafer can be simultaneously diced into the individual handle assemblies 300 (1308).

Figure 15:
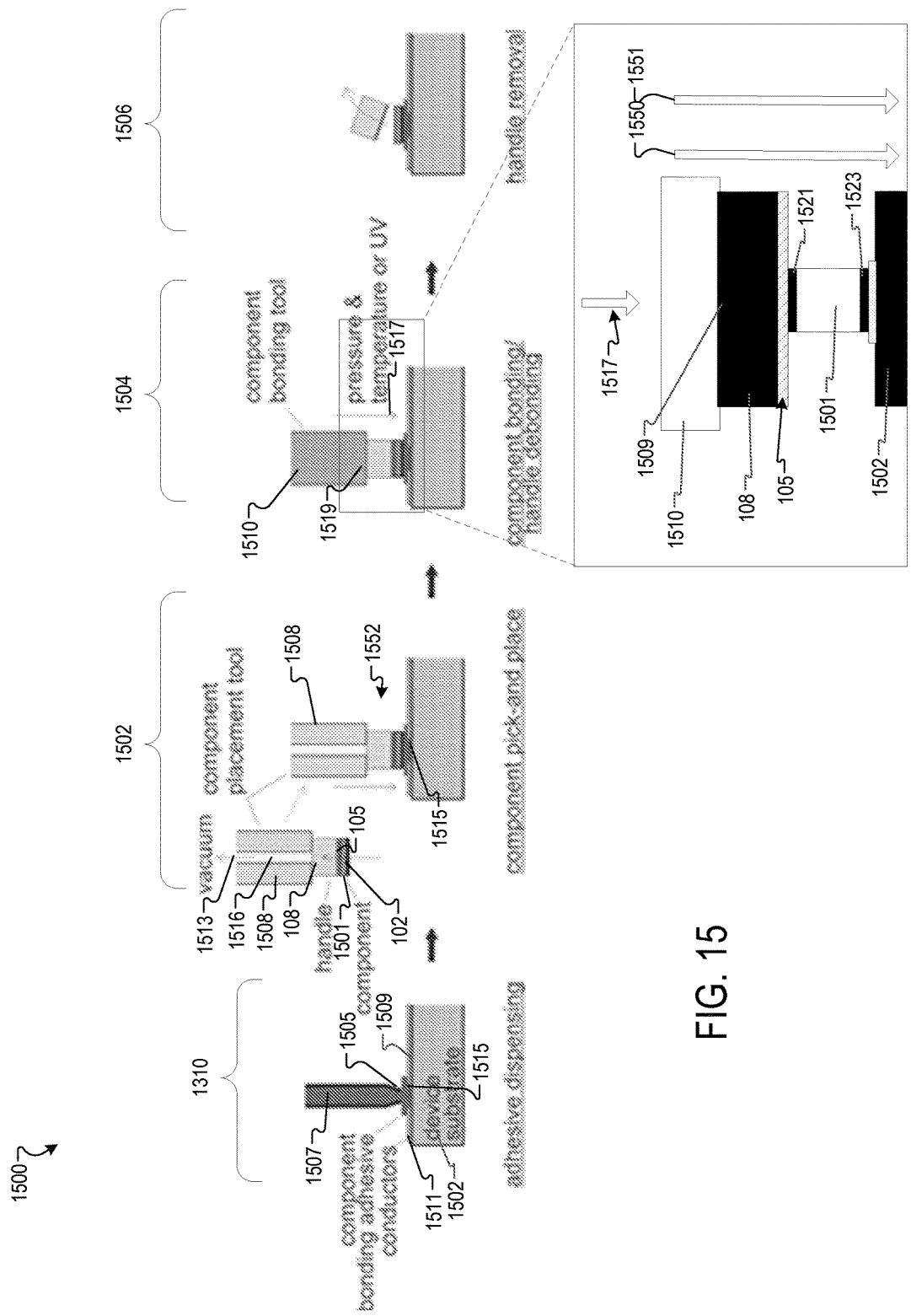
FIG. 15 is a schematic view showing an example of a process for use with the discrete component packaging process of FIG. 13.

As shown in FIG. 15, the processes for packaging a discrete component, as described above, can be modified as illustrated in a process 1500 for attaching a discrete component 1501 to a device substrate 1502. For example, the device substrate 1502 is first prepared (1310) for attaching to the discrete component 1501 by dispensing an amount of adhesive 1505 through a dispensing tube 1507 onto the device substrate surface 1509 (including conductors 1511) at a location 1515 of the device substrate 1502 where the discrete location is to be attached.

The process 1500 can then generally include picking up (1502) the handle assembly 1552 (which includes the discrete component 1501, the handle substrate 108, the release layer 105) by applying a vacuum 1513 through a vacuum tube 1516 of a discrete component transfer tool 1508. The transfer tool with the handle assemble is then positioned (1502) over the location 1515 of the device substrate as also shown in FIGS. 13 and 14, aligning the discrete component with the attachment adhesive on the device substrate 1502 (604 in FIG. 6). The discrete component is then moved into contact with the attachment adhesive 1505 (608 in FIG. 6) on the device substrate 1502.

After the discrete component contacts the attachment adhesive 1505 (608 in FIG. 6) (which may or may not be at that moment in a somewhat fluid state) on the device substrate 1502, the vacuum in the vacuum tube can be broken to release the transfer tool 1508 from the handle and the transfer tool can be moved away. Then a separate discrete component bonding tool 1510 may be moved into contact with the discrete component. Pressure 1550 or energy 1551, e.g., thermal or UV energy, or both, then can be applied 1517 to the discrete component 1501, the handle substrate 108, the release layer 105 through a contact surface 1519 of the bonding tool 1510 into the handle and also through the handle to the bond 1521, through the bond to the discrete component 1501, and through the discrete component 1501 to the bond 1523 with the device substrate. The pressure or energy or both can simultaneously or in sequence cause the bond 1521 between the discrete component and the handle substrate to weaken and the bond 1523 between the discrete component and the device substrate to strengthen (1504). When pressure is being applied, the pressure can operate simultaneously to weaken the bond 1521 and to strengthen the bond 1523. When energy is being applied, in some cases, the energy must flow through the successive elements of the system so that the weakening of bond 1521 may begin or be completed before the strengthening of the bond 1523 begins or is completed, or the weakening and the strengthening can occur in sequence.

In some cases the release layer 105 and the attachment adhesive are selected such that the bond 1523 between the discrete component 1501 and the device substrate 1502 forms before the bond 1521 is formed between the handle and the discrete component 1501, or the formation of the bond 1523 and the bond 1521 can occur simultaneously with complete overlap in time, or the formation can overlap partly with either the bond 1523 or the bond 1521 partly occurring earlier than or later than the overlapping period. The formation of either the bond 1523 or the bond 1521 can include a hardening or softening of a material, e.g., a wax material.

For example, in some cases, the release layer 105, the attachment adhesive 1505, or both the release layer 105 and the attachment adhesive 1505 may include one or more materials that soften or harden in response to an application of energy. In this case, the softening of the bond 1523 can occur before the hardening of the bond 1521, or the softening of the bond 1523 can occur after the hardening of the bond 1521, or the two events can occur simultaneously with complete overlap in time, or they can overlap but one or the other can partly occur earlier than or later than the overlapping period.

Once the weakening and strengthening after progresses to an appropriate degree, the discrete component bonding tool 1510 may be removed leaving the handle assembly (including the discrete component 1501, the handle substrate 108, the release layer 105) in contact with the discrete component, which is bonded to the device substrate 1502. While not bonded to the discrete component (because of the weakening of bond 1523), the handle remains in contact with the discrete component, for example, due to gravitational force, surface attraction force, or residual adhesive force remaining after the debonding process, or a combination of two or more of these forces the two. The handle substrate may then be removed (1506) from the discrete component using any of a variety of separation techniques, e.g., brushing, compressed air, vacuum, vibration, liquid jet, electrostatic, electromagnetic force reorienting the device substrate such that gravity separates the handle from the discrete component, or any combination of two or more of those. In general, a variety of separation techniques are contemplated, e.g., techniques applying force, energy, contact, and any combination of two or more of these to separate the handle substrate from the discrete component so long as the discrete component and/or the handle substrate are not damaged.

In some examples, the discrete transfer tool 1508 may be configured to apply a vacuum force to the handle assembly similarly to the use of the discrete component transfer tool 602 in FIG. 6. In some examples, the discrete transfer tool 1508 may be configured to apply pressure, heat, or UV light, or a combination of them to the handle assembly similarly to use of the discrete component transfer tool 602 in FIG. 6.

Although FIG. 15 shows the removal of one handle assembly; the same separation technique or techniques may be used to remove two or more handle assemblies at the same time. For example, multiple handle substrates may be arranged in proximity to each other such that a brush, a blade, an application of compressed air, an application of a vacuum, or an application of a vibrational force, or any combination of two or more of them, may remove the two or more handle assemblies from their corresponding discrete components.

While FIG. 15 shows an example of a process for use with the discrete component packaging process of FIG. 13, the process here may also be similarly used to remove the handles with the processes shown in FIGS. 4, 7, and 10.

What is claimed is:

1. A method comprising:
   attaching a release layer to a handle substrate, in which the release layer comprises multiple layers, in which a first layer of the multiple layers is a permanent adhesive and a second layer of the multiple layers is one or more of thermally sensitive and UV sensitive;
   releasing a discrete component from an interim handle and depositing the discrete component on the handle substrate such that the discrete component is releasably attached to the release layer, the discrete component having an ultra-thin, an ultra-small, or an ultra-thin and ultra-small configuration, at least one side of the handle substrate having a length longer than at least one side of the discrete component; and depositing the discrete component onto a device substrate and releasing the discrete component from the handle substrate, in which depositing the discrete component onto the device substrate comprises interconnecting the discrete component to the device substrate.

2. The method of claim 1 in which the second layer of the multiple layers of the release layer comprises a thermally sensitive material, and in which the thermal sensitivity of the second layer causes a change in an adhesive strength of the release layer in response to an application of thermal energy.

3. The method of claim 1 in which the second layer of the multiple layers of the release layer comprises an ultraviolet ("UV") light sensitive material, and in which the UV light sensitivity of the second layer causes a change in an adhesive strength of the release layer in response to an application of a UV light.

4. A method comprising:
attaching a release layer to a handle substrate;
releasing a discrete component from an interim handle and depositing the discrete component on the handle substrate such that the discrete component is releasably attached to the release layer, the discrete component having an ultra-thin, an ultra-small, or an ultra-thin and ultra-small configuration, at least one side of the handle substrate having a length longer than at least one side of the discrete component; and
depositing the discrete component onto a device substrate and releasing the discrete component from the handle substrate, in which depositing the discrete component onto the device substrate comprises interconnecting the discrete component to the device substrate, in which releasing the discrete component from the handle is at least partially contemporaneous with interconnecting the discrete component to the device substrate.

5. The method of claim 4 in which the releasing of the discrete component from the handle and the interconnecting of the discrete component to the device substrate are in response to a common trigger.

6. The method of claim 4 in which the interconnecting further comprises delivering thermal energy or UV-light to both interconnect the discrete component with the substrate and release the discrete component from the handle.

7. A method comprising
a. applying a process step to cause a material between a surface of an ultra-thin, an ultra-small, or an ultra-thin and ultra-small discrete component and a substrate to which the ultra-thin and ultra-small discrete component is to be attached, to change to a state in which the material holds the ultra-thin and ultra-small discrete component on the substrate,
b. the processing step at least partially concurrently causing or resulting in a material that temporarily holds an opposite surface of the ultra-thin and ultra-small discrete component on a handle that is being held by a chuck of a pick and place tool, to change to a state in which the material no longer holds the ultra-thin and ultra-small discrete component to the handle.

8. The method of claim 7 in which causing the change in state comprises delivering thermal energy, UV light, or both.

9. The method of claim 7 in which the material that temporarily holds an opposite surface of the discrete component on a handle substrate comprises a release layer comprising multiple layers, in which a first layer of the multiple layers is a permanent adhesive and a second layer of the multiple layers is one or more of thermally sensitive and UV sensitive.

10. The method of claim 9 in which the release layer comprises a thermally sensitive material, and in which the thermal sensitivity of the release layer causes a change in an adhesive strength of the release layer in response to an application of thermal energy.

11. The method of claim 9 in which the release layer comprises a UV light sensitive material, and in which the UV light sensitivity of the release layer causes a change in an adhesive strength of the release layer in response to an application of a UV light.

12. A method comprising:
attaching a release layer to the handle substrate, in which the release layer comprises multiple layers, wherein a first layer of the multiple layers is permanent adhesive and a second layer of the multiple layers is one or more of thermally sensitive and UV sensitive;
depositing an ultra-thin wafer onto the handle substrate such that the ultra-thin wafer is releasably attached to the release layer;
releasing a discrete component from the ultra-thin wafer, the discrete component having an ultra-thin configuration, handle substrate having a thickness of at least 50 microns; and
depositing the discrete component onto a device substrate and releasing the discrete component from the handle substrate, in which depositing the discrete component onto the device substrate comprises interconnecting the discrete component to the device substrate.

13. The method of claim 12 in which releasing the discrete component comprises dicing the ultra-thin wafer.

14. The method of claim 12 in which dicing the ultra-wafer further comprises dicing the handle substrate to form a diced-handle substrate such that the discrete component is releasably attached to the handle substrate.

15. A method comprising:
depositing an ultra-thin wafer onto a handle substrate;
releasing a discrete component from the ultra-thin wafer, the discrete component having an ultra-thin configuration, handle substrate having a thickness of at least 50 microns; and
depositing the discrete component onto a device substrate and releasing the discrete component from the handle substrate, in which depositing the discrete component onto the device substrate comprises interconnecting the discrete component to the device substrate, in which releasing the discrete component from the handle is at least partially contemporaneous with interconnecting the discrete component to the device substrate.

16. The method of claim 15 in which releasing the discrete component from the handle is in response to or caused by the interconnecting of the discrete component to the device substrate.

17. The method of claim 15 in which the interconnecting comprises delivering thermal energy or UV-light to both interconnect the discrete component with the substrate and release the discrete component from the handle.

18. The method of claim 15 comprising thinning a wafer to form the ultra-thin wafer.

19. A method comprising:
using a releasable layer to attach a handle substrate to a discrete component, in which the releasable layer comprises multiple layers, wherein a first layer of the multiple layers is a permanent adhesive and a second layer of the multiple layers is one or more of thermally sensitive and UV sensitive;

while the handle substrate is attached to the discrete component, using a tool to hold the handle substrate and cause the discrete component to contact an adhesive layer on the device substrate; and causing the releasable layer to release the handle substrate from the discrete component and causing the discrete component to become attached to the device substrate at the adhesive layer.

20. The method of claim 19 in which the second layer of the multiple layers of the releasable layer comprises a thermally sensitive material, and in which the thermal sensitivity of the second layer causes a change in an adhesive strength of the second layer in response to an application of thermal energy.

21. The method of claim 19 in which the second layer of the multiple layers of the releasable layer comprises an ultraviolet light sensitive material, and in which the ultraviolet light sensitivity of the second layer causes a change in an adhesive strength of the second layer in response to an application of an application of an ultraviolet light.

22. A method comprising:

using a releasable layer to attach a handle substrate to a discrete component, while the handle substrate is attached to the discrete component, using a tool to hold the handle substrate and cause the discrete component to contact an adhesive layer on the device substrate, and causing the releasable layer to release the handle substrate from the discrete component and causing the discrete component to become attached to the device substrate at the adhesive layer, in which releasing the discrete component from the handle is at least partially contemporaneous with attaching the discrete component to the device substrate.

23. The method of claim 22 in which the releasing of the discrete component from the handle and the interconnecting of the discrete component to the device substrate are in response to a common trigger.

* * * * *

UNITED STATES PATENT AND TRADEMARK OFFICE
CERTIFICATE OF CORRECTION

PATENT NO.        : 10,529,614 B2
APPLICATION NO.   : 15/501330
DATED             : January 7, 2020
INVENTOR(S)       : Val Marinov Page 1 of 1

It is certified that error appears in the above-identified patent and that said Letters Patent is hereby corrected as shown below:

In the Claims

On Column 22, Line 2, in Claim 21, delete "application of an application of an" and insert -- application of an --, therefor.

Signed and Sealed this
Nineteenth Day of January, 2021

Andrei Iancu
*Director of the United States Patent and Trademark Office*